US012795930B2

(12) United States Patent
Cho

(10) Patent No.: US 12,795,930 B2
(45) Date of Patent: Nov. 10, 2026

(54) MEMORY DEVICE INCLUDING STACKED PASS TRANSISTORS

(71) Applicant: SAMSUNG ELECTRONICS CO., LTD., Suwon-si (KR)

(72) Inventor: Dooho Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 383 days.

(21) Appl. No.: 18/374,392

(22) Filed: Sep. 28, 2023

(65) Prior Publication Data

US 2024/0224531 A1 Jul. 4, 2024

(30) Foreign Application Priority Data

Dec. 29, 2022 (KR) ........................ 10-2022-0188322

(51) Int. Cl.
*H10B 43/35* (2023.01)
*H10B 41/27* (2023.01)
(Continued)

(52) U.S. Cl.
CPC ............. *H10B 43/35* (2023.02); *H10B 41/27* (2023.02); *H10B 41/35* (2023.02); *H10B 43/27* (2023.02);
(Continued)

(58) Field of Classification Search
CPC ........ H10B 43/35; H10B 41/27; H10B 41/35; H10B 43/27; H10B 80/00; H01L 24/08;
(Continued)

(56) References Cited

U.S. PATENT DOCUMENTS 6,881,994 B2 4/2005 Lee et al.
9,123,420 B2 9/2015 Rabkin et al.
(Continued)

FOREIGN PATENT DOCUMENTS

KR 10-2020-0074304 A 6/2020
KR 10-2022-0037282 A 3/2022

OTHER PUBLICATIONS

Extended European Search Report dated Mar. 18, 2024 in European Application No. 23197080.7.
(Continued)

*Primary Examiner* — Benjamin Tzu-Hung Liu
(74) *Attorney, Agent, or Firm* — Sughrue Mion, PLLC

(57) ABSTRACT

A memory device including a memory block including a plurality of wordlines stacked in a vertical direction and extending in a first horizontal direction; and a pass transistor block including a plurality of pass transistors stacked in the vertical direction, wherein the plurality of pass transistors are configured to transmit a plurality of driving signals respectively to the plurality of wordlines, wherein each pass transistor of the plurality of pass transistors includes: a body region having an upper surface and a lower surface which face in the vertical direction, a first side surface and a second side surface which face in the first horizontal direction, and a front surface and a rear surface which face in a second horizontal direction; a first source-drain electrode on the first side surface, and configured to receive a corresponding driving signal of the plurality of driving signals; a second source-drain electrode on the second side surface, wherein the second source-drain electrode is electrically connected to a side surface of a corresponding wordline of the plurality of wordlines; and a first vertical gate electrode on a first surface from among the front surface and the rear surface.

20 Claims, 27 Drawing Sheets

(51) Int. Cl.

| | |
|---|---|
| ***H10B 41/35*** | (2023.01) |
| ***H10B 43/27*** | (2023.01) |
| ***H10B 80/00*** | (2026.01) |
| ***H10W 90/00*** | (2026.01) |

(52) U.S. Cl.
CPC ............ *H10B 80/00* (2023.02); *H10W 90/00* (2026.01); *H10W 90/792* (2026.01)

(58) Field of Classification Search
CPC ................. H01L 25/0657; H01L 25/18; H01L 2224/08145; H01L 2924/1431; H01L 2924/14511; H10W 90/00; H10W 90/792
See application file for complete search history.

(56) References Cited

U.S. PATENT DOCUMENTS

| | | | | |
|---|---|---|---|---|
| 9,893,084 | B2 | 2/2018 | Rhie | |
| 10,453,798 | B2 | 10/2019 | Tsutsumi et al. | |
| 10,615,173 | B2 | 4/2020 | Kim et al. | |
| 10,804,274 | B2 * | 10/2020 | Bi | H10B 43/20 |
| 10,910,364 | B2 | 2/2021 | Or-Bach et al. | |
| 10,930,672 | B2 | 2/2021 | Cho et al. | |
| 11,276,704 | B2 | 3/2022 | Gardner et al. | |
| 11,355,194 | B2 | 6/2022 | Yun et al. | |
| 11,626,418 | B2 * | 4/2023 | Ninomiya | H01L 25/0657 257/314 |
| 11,950,423 | B2 | 4/2024 | Lee et al. | |
| 2015/0076579 | A1 | 3/2015 | Tsuji et al. | |
| 2018/0294277 | A1 * | 10/2018 | Kim | G11C 16/0483 |
| 2020/0194455 | A1 * | 6/2020 | Cho | H10B 41/27 |

OTHER PUBLICATIONS

Communication issued on May 19, 2026 by the Korean Ministry of Intellectual Property (MOIP) in Korean Patent Application No. 10-2022-0188322.

* cited by examiner

1300

BLKi

6000

MEMORY DEVICE INCLUDING STACKED PASS TRANSISTORS

CROSS-REFERENCE TO RELATED APPLICATION

This application is based on and claims priority under 35 USC § 119 to Korean Patent Application No. 10-2022-0188322, filed on Dec. 29, 2022, in the Korean Intellectual Property Office, the disclosure of which is incorporated by reference herein in its entirety.

BACKGROUND

1. Field

The disclosure relates to semiconductor integrated circuits, and more particularly to a memory device including stacked pass transistors.

2. Description of Related Art

In some semiconductor integrated circuits, a high-voltage transistor may transfer a high voltage between source-drain regions of the high-voltage transistor. For example, a high voltage may be applied to a gate of the high-voltage transistor and a gate insulating film under the gate may have a sufficient thickness that may sustain the high voltage. Alternatively or additionally, a length of a channel of the high-voltage transistor may be longer than that of a low-voltage transistor, in order to allow the high-voltage transistor to endure an electric field which is applied to it. For example, the channel of the high-voltage transistor may be configured to endure a punch-through phenomenon caused by the high voltage between the source-drain regions. As a result, the high-voltage transistor may have an area wider than the low-voltage transistor. In particular, to improve the degree of integration of the memory device, the number of wordlines stacked in a direction perpendicular to an upper surface of a substrate may increase. In this case, a chip size may increase due to an increase in the number of pass transistors connected to wordlines.

SUMMARY

Provided is a memory device including stacked pass transistors that may be implemented with a reduced occupation area.

Additional aspects will be set forth in part in the description which follows and, in part, will be apparent from the description, or may be learned by practice of the presented embodiments.

In accordance with an aspect of the disclosure, a memory device includes a memory block including a plurality of wordlines stacked in a vertical direction and extending in a first horizontal direction; and a pass transistor block including a plurality of pass transistors stacked in the vertical direction, wherein the plurality of pass transistors are configured to transmit a plurality of driving signals respectively to the plurality of wordlines, wherein each pass transistor of the plurality of pass transistors includes: a body region having an upper surface and a lower surface which face in the vertical direction, a first side surface and a second side surface which face in the first horizontal direction, and a front surface and a rear surface which face in a second horizontal direction; a first source-drain electrode on the first side surface, and configured to receive a corresponding driving signal of the plurality of driving signals; a second source-drain electrode on the second side surface, wherein the second source-drain electrode is electrically connected to a side surface of a corresponding wordline of the plurality of wordlines; and a first vertical gate electrode on a first surface from among the front surface and the rear surface.

In accordance with an aspect of the disclosure, a memory device includes a plurality of memory blocks, wherein each memory block of the plurality of memory blocks includes a plurality of wordlines stacked in a vertical direction and extending in a first horizontal direction; and a plurality of pass transistor blocks, wherein each pass transistor block from among the plurality of pass transistor blocks includes a plurality of pass transistors stacked in the vertical direction, and is configured to transmit a plurality of driving signals to a plurality of wordlines included in a corresponding memory block, wherein each pass transistor of the plurality of pass transistors includes: a body region having an upper surface and a lower surface which face in the vertical direction, a first side surface and second side surface which face in the first horizontal direction, and a front surface and a rear surface which face in a second horizontal direction; a first source-drain electrode on the first side surface, and configured to receive a corresponding driving signal of the plurality of driving signals; a second source-drain electrode on the second side surface, wherein the second source-drain electrode is electrically connected to a side surface of a corresponding wordline of the plurality of wordlines; and a first vertical gate electrode on a first surface from among the front surface and the rear surface.

In accordance with an aspect of the disclosure, a memory device includes a plurality of first bonding metal patterns in a cell region; a plurality of second bonding metal patterns in a peripheral region under the cell region, wherein the peripheral region is vertically coupled to the cell region by the plurality of first bonding metal patterns and the plurality of second bonding metal patterns; a plurality of memory blocks in the cell region, wherein each memory block includes a plurality of wordlines stacked in a vertical direction and extending in a first horizontal direction; and a plurality of pass transistor blocks in the cell region, wherein each pass transistor block from among the plurality of pass transistor blocks includes a plurality of pass transistors stacked in the vertical direction, and configured to transmit a plurality of driving signals to a plurality of wordlines included in a corresponding memory block, wherein each pass transistor of the plurality of pass transistors includes: a body region having an upper surface and a lower surface which face in the vertical direction, a first side surface and second side surface which face in the first horizontal direction, and a front surface and a rear surface which face in a second horizontal direction; a first source-drain electrode on the first side surface, and configured to receive a corresponding driving signal of the plurality of driving signals; a second source-drain electrode on the second side surface, wherein the second source-drain electrode is electrically connected to a side surface of a corresponding wordline of the plurality of wordlines; and a first vertical gate electrode on a first surface from among the front surface and the rear surface.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
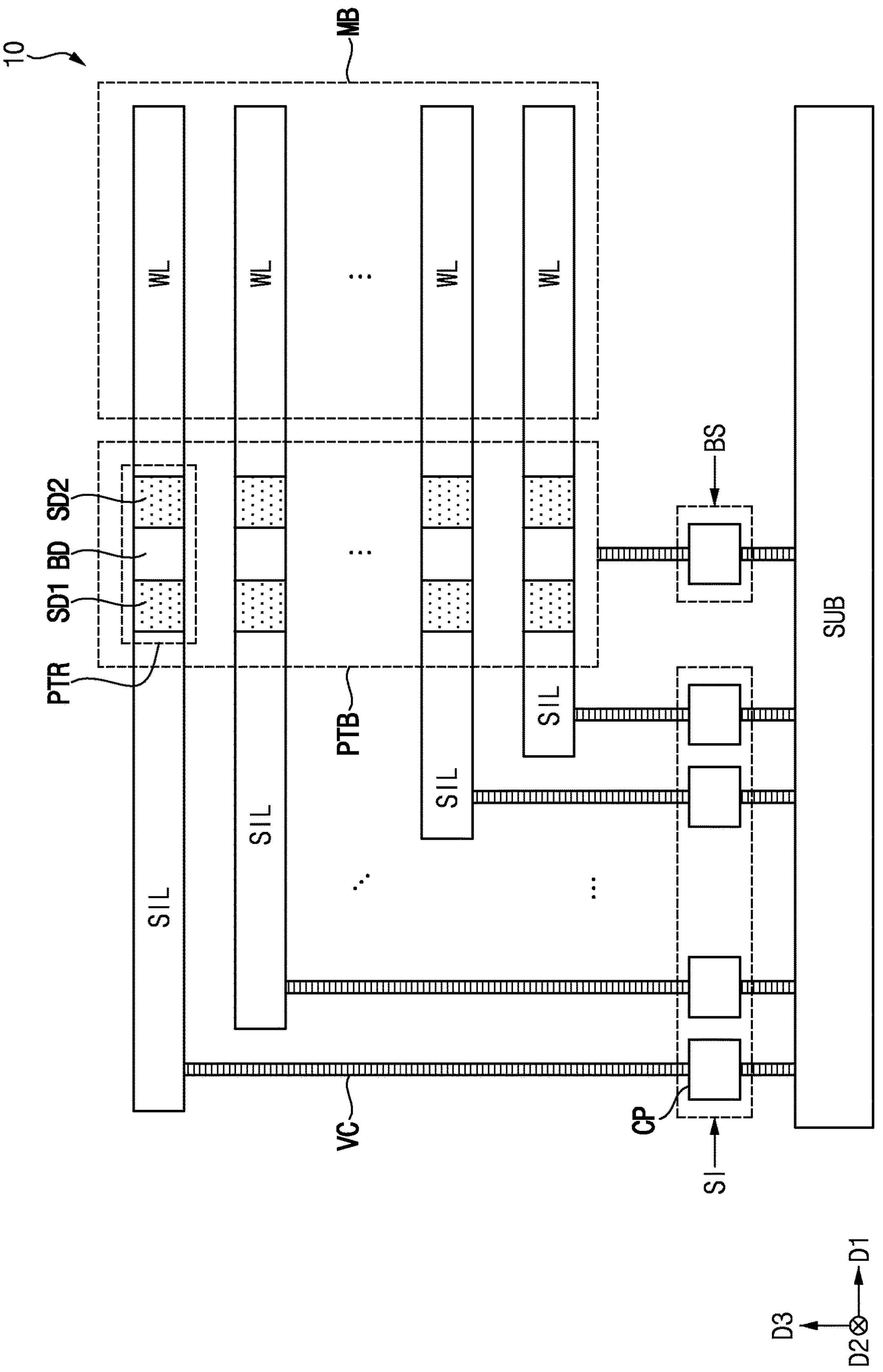
FIG. 1 is a diagram illustrating a vertical structure of a memory device according to example embodiments.

Various example embodiments will be described more fully hereinafter with reference to the accompanying drawings, in which some example embodiments are shown. In the drawings, like numerals may refer to like elements throughout. Throughout the description, redundant or duplicative descriptions may be omitted.

Hereinafter, a direction substantially perpendicular to a top surface of a semiconductor substrate may be referred to as a vertical direction D3, and two directions parallel to the top surface of the semiconductor substrate and crossing each other may be referred to as a first horizontal direction D1 and a second horizontal direction D2. The first horizontal direction D1 may be referred to as a first direction or row direction, the second horizontal direction D2 may be referred to as a second direction or column direction, and the vertical direction may be referred to as a third direction. For example, the first horizontal direction D1 and the second horizontal direction D2 may be substantially perpendicular to each other. A direction indicated by an arrow on the drawing and an opposite direction thereof may be referred to as the same direction. The definition of the foregoing direction is the same in all drawings hereinafter.

Figure 2:
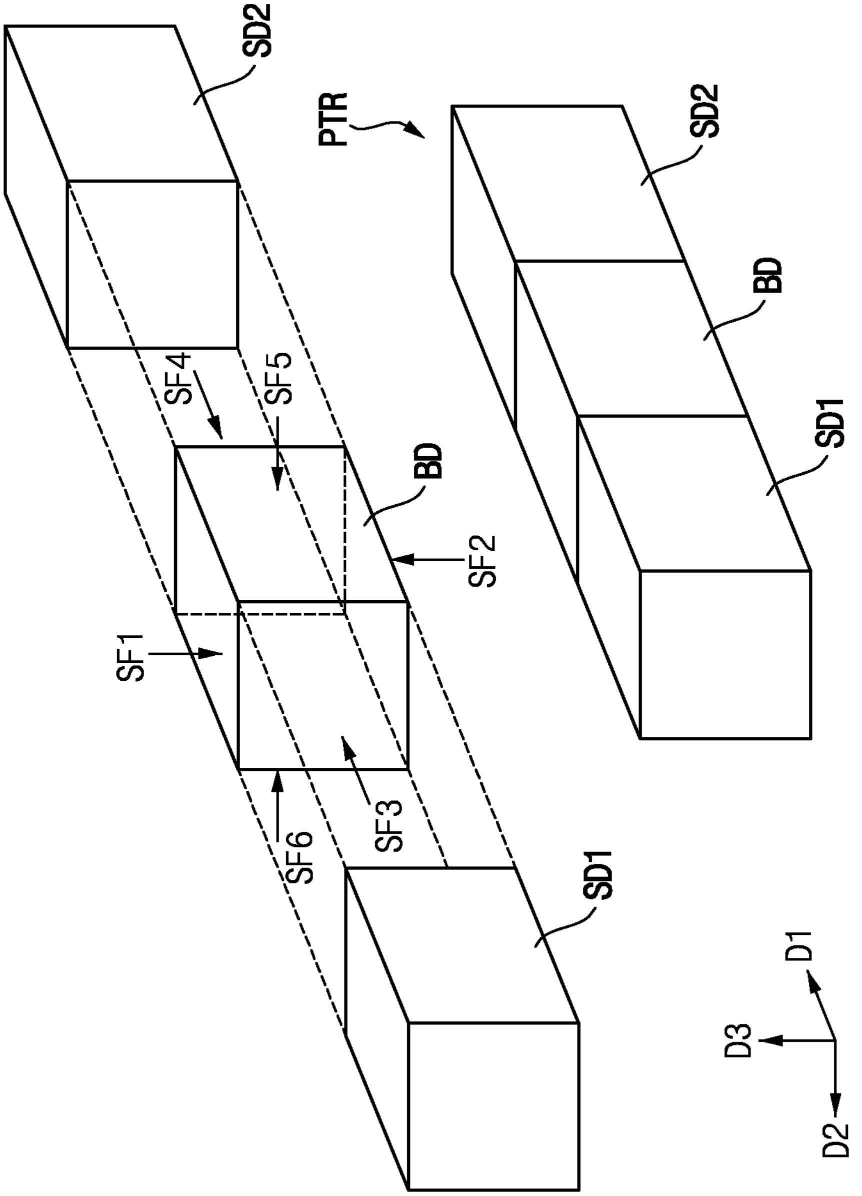
FIG. 2 is a diagram illustrating a conceptual structure of a pass transistor included in a memory device according to example embodiments.

FIG. 1 is a diagram illustrating a vertical structure of a memory device according to example embodiments, and FIG. 2 is a diagram illustrating a conceptual structure of a pass transistor included in a memory device according to example embodiments.

Referring to FIG. 1, a memory device 10 may include at least one memory block MB and at least one pass transistor block PTB. According to embodiments, examples of which are described below with reference to FIGS. 21, 22 and 23, the memory device 10 may include a plurality of memory blocks and a plurality of pass transistor blocks arranged in the second horizontal direction D2.

The memory block MB may include a plurality of wordlines WL stacked on a semiconductor substrate SUB in the vertical direction D3 and extend or are elongated in the first horizontal direction D1. Examples of the memory block MB are described below with reference to FIGS. 18, 21, 22 and 23.

The pass transistor block PTB includes a plurality of pass transistors PTR that are stacked in the vertical direction D3 and transfers a plurality of driving signals SI respectively to the plurality of wordlines WL of the memory block MB. Examples of transferring the plurality of driving signals SI through the pass transistor block PTB are described below with reference to FIGS. 19 and 20.

Referring to FIGS. 1 and 2, each pass transistor PTR may include a body region BD, a first source-drain electrode SD1 and a second source-drain electrode SD2. In FIG. 2, for convenience of illustration and description, a body region BD, a first source-drain electrode SD1 and a second source-drain electrode SD2 included in each pass transistor PTR are separately shown.

The body region BD may have an upper surface SF1 and a lower surface SF2 facing away from each other in the vertical direction D3, a first side surface SF3 and a second side surface SF4 facing away from each other in the first horizontal direction D1, and a front surface SF5 and a rear surface SF6 facing away from each other in the horizontal direction D2. Accordingly, the body region BD may have a hexahedral shape having six faces, but the embodiments are not limited thereto.

The first source-drain electrode SD1 may be disposed to be bonded to the first side surface SF3 of the body region BD, and each driving signal SI may be applied to the first source-drain electrode SD1. The second source-drain electrode SD2 may be disposed to be bonded to the second side surface SF4 of the body region BD and the second source-drain electrode SD2 may be electrically connected to the side surface of each wordline WL.

In some example embodiments, as shown in FIG. 1, each pass transistor PTR may be disposed at the same position or the same height as each wordline WL in the vertical direction D3. In this case, the second source-drain electrode SD2 may be directly bonded to each wordline WL.

In some example embodiments, examples of which are described below with reference to FIGS. 12, 13 and 14, two or more pass transistors PTR respectively connected to two or more wordlines WL may be disposed adjacent to each other in the first horizontal direction D1 and may be arranged in the second horizontal direction D2. In this case, as is described below with reference to FIGS. 12, 13 and 14, each wordline WL and each pass transistor PTR may be connected through a vertical connection conductor and a horizontal connection conductor.

In some embodiments, the pass transistor PTR may include a gate electrode. Example embodiments of the gate structure of the pass transistor PTR are described below with reference to FIGS. 3 to 11.

According to embodiments, as shown in FIG. 1, the memory device 10 may include driving signal lines SIL to apply the plurality of driving signals SI respectively to the first source-drain electrodes SD1 of the pass transistors PTR. The driving signal lines SIL may be connected to peripheral circuits disposed on the semiconductor substrate SUB through vertical contacts VC and conductive patterns CP.

A block selection signal BS to turn on the pass transistors PTR of the corresponding memory block may be transferred to the pass transistor block PTB through various wiring routing. In some example embodiments, as shown in FIG. 1, the block selection signal BS may be connected to peripheral circuits formed on the semiconductor substrate SUB through vertical contacts VC and conductive patterns CP disposed below the pass transistor block PTB.

In some implementations, the pass transistors may be included in peripheral circuits formed on the semiconductor substrate SUB. In this case, as the number of stacked wordlines increases, the area of the pass transistors PTR increases, a design margin or usable area for circuit drawing is reduced, and wiring routing becomes complicated. As a result, as the number of stacked wordlines increases, the occupied area and power consumption of the memory device increase.

In contrast, in the memory device 10 according to example embodiments, the wordlines WL may be driven by the driving signals SI using the pass transistors PTR stacked in the vertical direction D3, and thus the area occupied by the memory device 10 may be reduced.

In addition, the memory device 10 according to example embodiments may simplify the wiring routing of the block selection signal BS and the driving signals SI applied to the stacked transistors PTR, and thus the design margin of the memory device 10 may be improved and the power consumption of the memory device 10 may be reduce.

Figure 3:
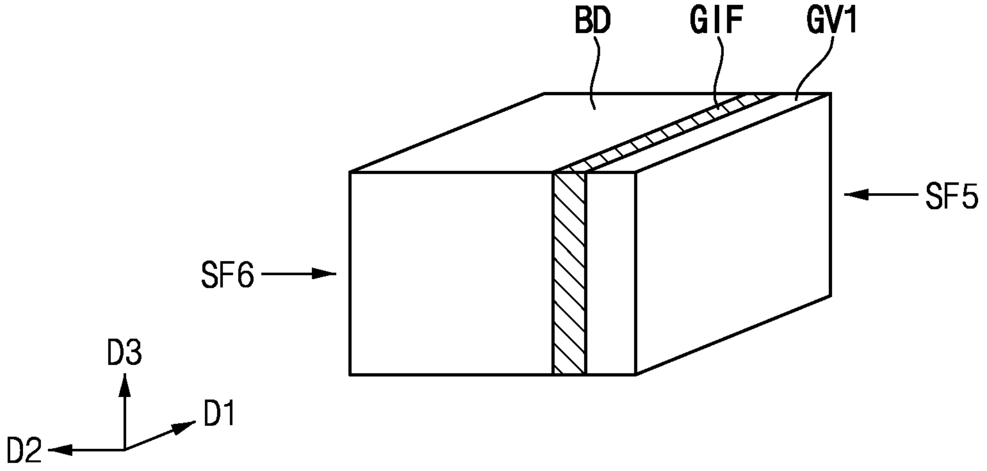
FIG. 3 is a diagram illustrating an example embodiment of a pass transistor having a single-face gate structure included in a memory device according to example embodiments.
Figure 4:
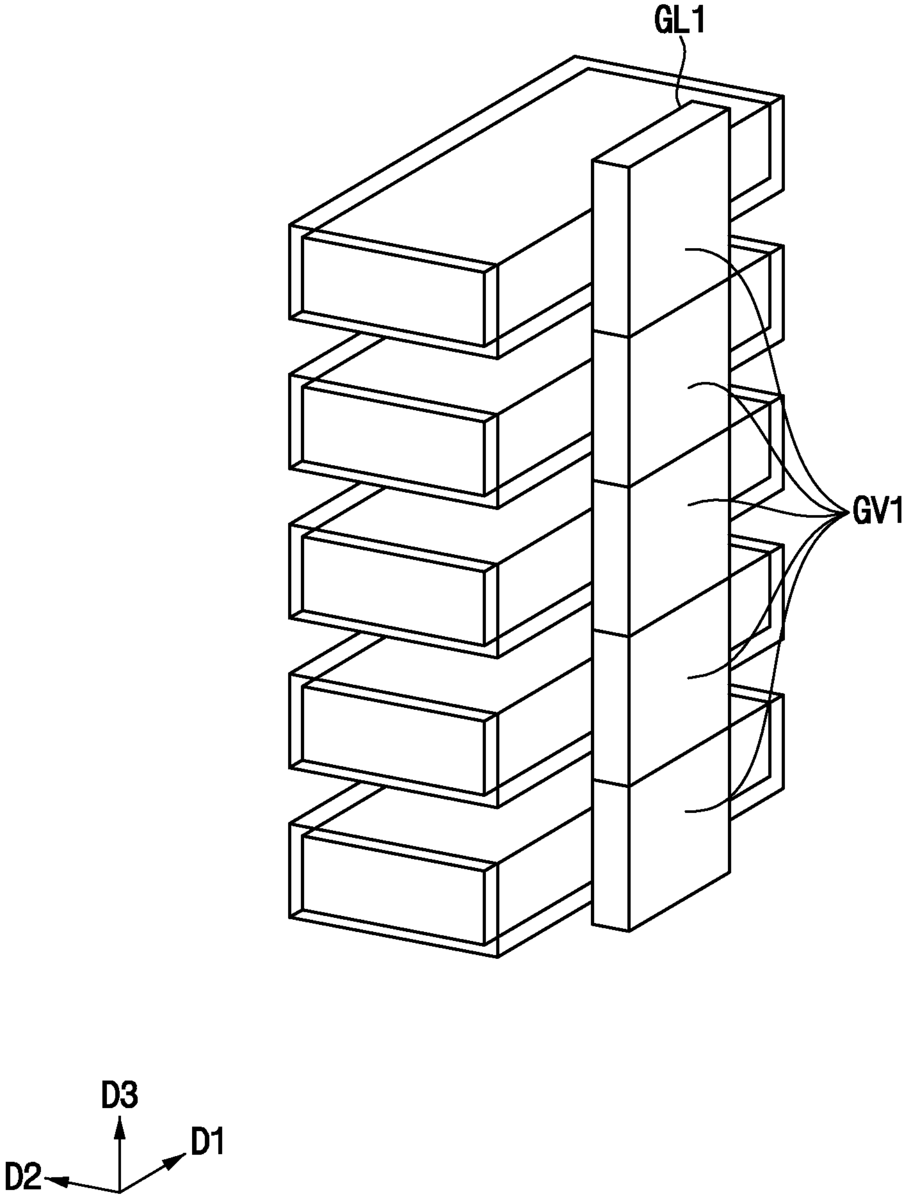
FIG. 4 is a diagram illustrating an example embodiment of stacked pass transistors according to the single-face gate structure of FIG. 3.

FIG. 3 is a diagram illustrating an example embodiment of a pass transistor having a single-face gate structure included in a memory device according to example embodiments, and FIG. 4 is a diagram illustrating an example embodiment of stacked pass transistors according to the single-face gate structure of FIG. 3.

Referring to FIG. 3, each pass transistor PTR may include a first vertical gate electrode GV1 disposed on a first surface among the front surface SF5 and the rear surface SF6 of the body region BD. FIG. 3 shows an example in which the first surface corresponds to the front surface SF5.

A gate insulating layer GIF may be disposed between the first vertical gate electrode GV1 and the first surface SF5 of the body region BD. Therefore, when the block selection signal BS having a turn-on voltage level is applied to the first vertical gate electrode GV1 and the pass transistor PTR is turned on, a channel of the pass transistor PTR may be formed on the first surface SF5 of the body region BD. For example, the channel width of the pass transistor PTR may correspond to the length of the body region BD in the vertical direction D3, and the channel length of the pass transistor PTR may correspond to the length of the body region BD in the first horizontal direction D1.

FIG. 4 illustrates a structure in which five pass transistors PTR having a single-face gate structure of FIG. 3 are stacked. The five first vertical gate electrodes GV1 corresponding to the five pass transistors PTR may form a first gate line GL1 extending in the vertical direction D3. Although FIG. 4 illustrates a structure corresponding to the five pass transistors PTR, embodiments are not limited thereto. For example, in some embodiments the first gate line GL1 may extend in the vertical direction D3 to correspond to the number of wordlines WL. For example, the first vertical gate electrodes GV1 respectively included in the plurality of pass transistors PTR of each pass transistor block PTB may form the first gate line GL1 extending in the vertical direction D3. As a result, the plurality of pass transistors PTR included in each pass transistor block PTB may be simultaneously switched based on the block select signal BS applied to the first gate line GL1.

Figure 5:
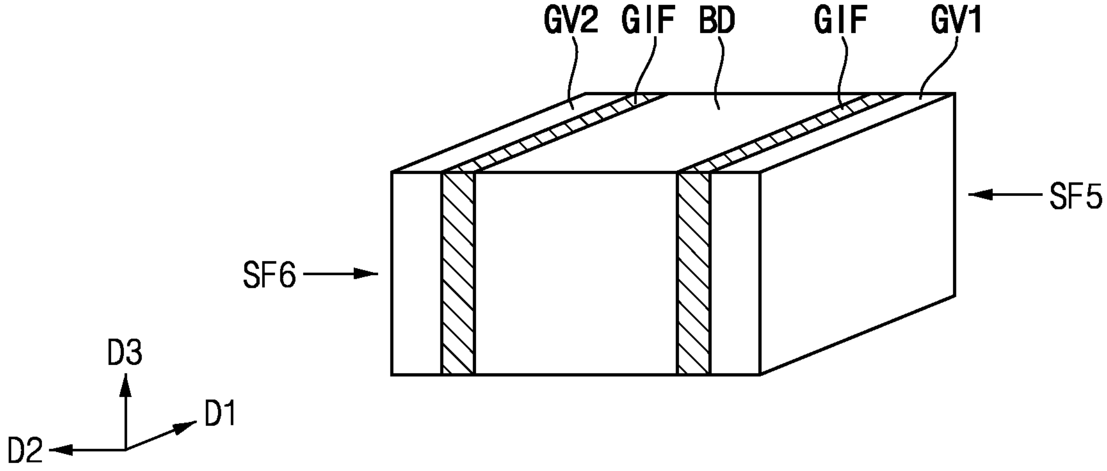
FIG. 5 is a diagram illustrating an example embodiment of a pass transistor having a two-face gate structure included in a memory device according to example embodiments.
Figure 6:
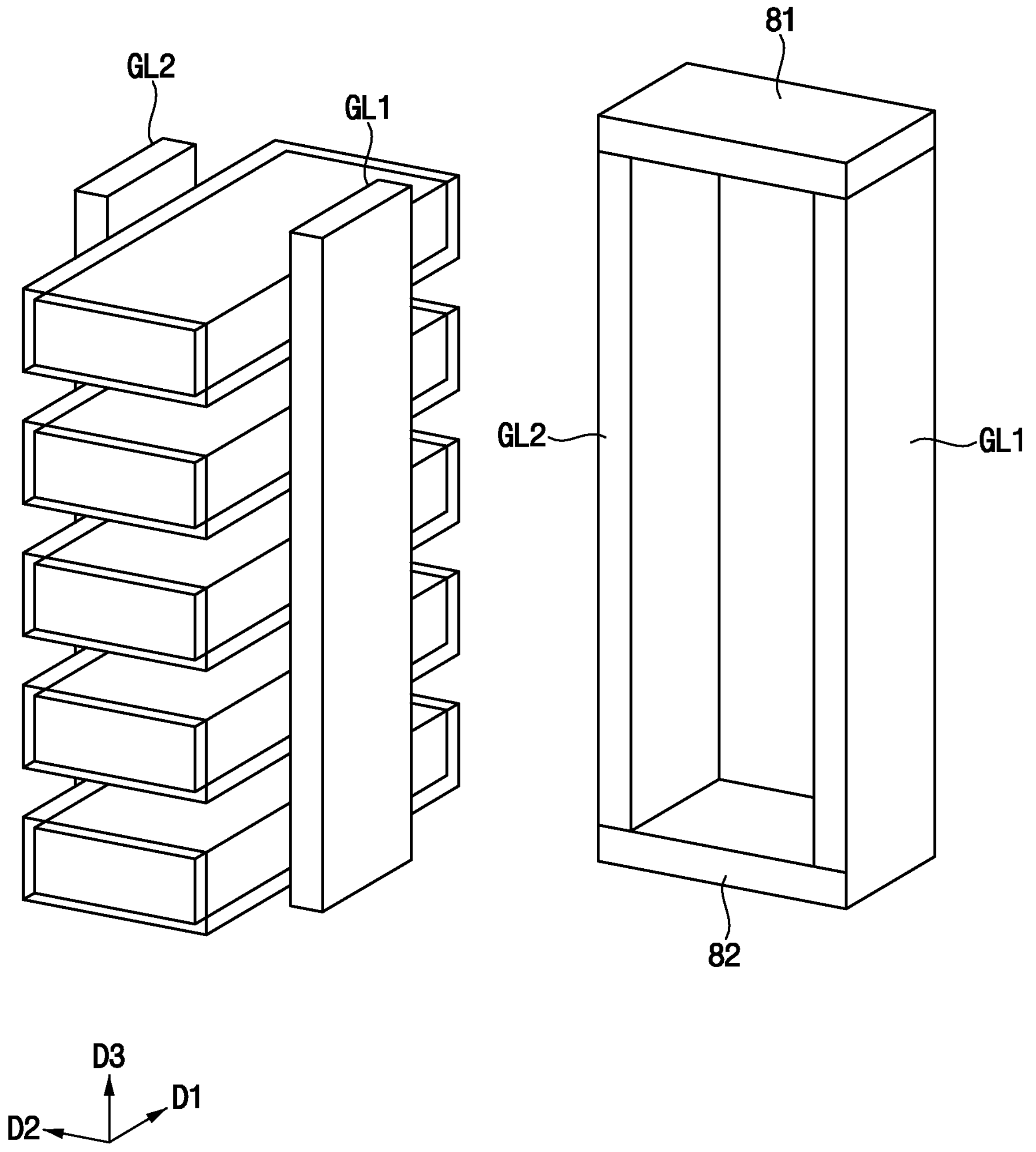
FIG. 6 is a diagram illustrating an example embodiment of stacked pass transistors according to the two-face gate structure of FIG. 5.

FIG. 5 is a diagram illustrating an example embodiment of a pass transistor having a two-face gate structure included in a memory device according to example embodiments, and FIG. 6 is a diagram illustrating an example embodiment of stacked pass transistors according to the two-face gate structure of FIG. 5.

Referring to FIG. 5, each pass transistor PTR may include a first vertical gate electrode GV1 disposed on a first surface among the front surface SF5 and the rear surface SF6 of the body region BD and a second vertical gate electrode GV2 disposed on a second surface among the front surface SF5 and the rear surface SF6. FIG. 5 illustrates an example in which the first surface corresponds to the front surface SF5 and the second surface corresponds to the rear surface SF6.

Gate insulating layers GIF may be placed between the first vertical gate electrode GV1 and the first surface SF5 of the body region BD and between the second vertical gate electrode GV2 and the second surface SF6 of the body region BD. Therefore, when the pass transistor PTR is turned on by applying the block select signal BS having a turn-on voltage level to the first vertical gate electrode GV1 and the second vertical gate electrode GV2, a channel of the pass transistor PTR may be formed on the first surface SF5 and the second surface SF6. For example, the channel width of the pass transistor PTR may correspond to twice the length of the body region BD in the vertical direction D3, and the channel length of the pass transistor PTR may correspond to the length of the body region BD in the first horizontal direction D1.

FIG. 6 shows a structure in which five pass transistors PTR having the two-face gate structure of FIG. 5 are stacked. The five first vertical gate electrodes GV1 corresponding to the five pass transistors PTR may form a first gate line GL1 extending in the vertical direction D3. Also, the five second vertical gate electrodes GV2 corresponding to the five pass transistors PTR may form a second gate line GL2 extending in the vertical direction D3.

Although FIG. 6 illustrates a structure corresponding to five pass transistors PTR, embodiments are not limited thereto. For example, in some embodiments the first gate line GL1 and the second gate line GL2 may be elongated in the vertical direction to correspond to the number of wordlines WL. For example, the first vertical gate electrodes GV1 respectively included in the plurality of pass transistors PTR of each pass transistor block PTB may form the first gate lines GL1 extending in the vertical direction D3, and the second vertical gate electrodes GV2 respectively included in the plurality of pass transistors PTR of each pass transistor block PTB may form the second gate line GL2 extending in the vertical direction D3. As a result, the plurality of pass transistors PTR included in each pass transistor block PTB may be switched simultaneously based on the block select signal BS applied to the first gate line GL1 and the second gate line GL2.

In some example embodiments, end portions in the vertical direction D3 of the first gate line GL1 and the second gate line GL2 may be electrically connected to each other. For example, as shown in the right portion of FIG. 6, an upper horizontal conductive line 81 may be disposed to connect the upper end portions of the first gate line GL1 and the second gate line GL2 and/or a lower horizontal conductive line 82 may be disposed to connect the lower end portions of the first gate line GL1 and the second gate line GL2. In some example embodiments, the block selection signal BS may be applied to the upper horizontal line 81 and/or the lower horizontal line 82.

Figure 7:
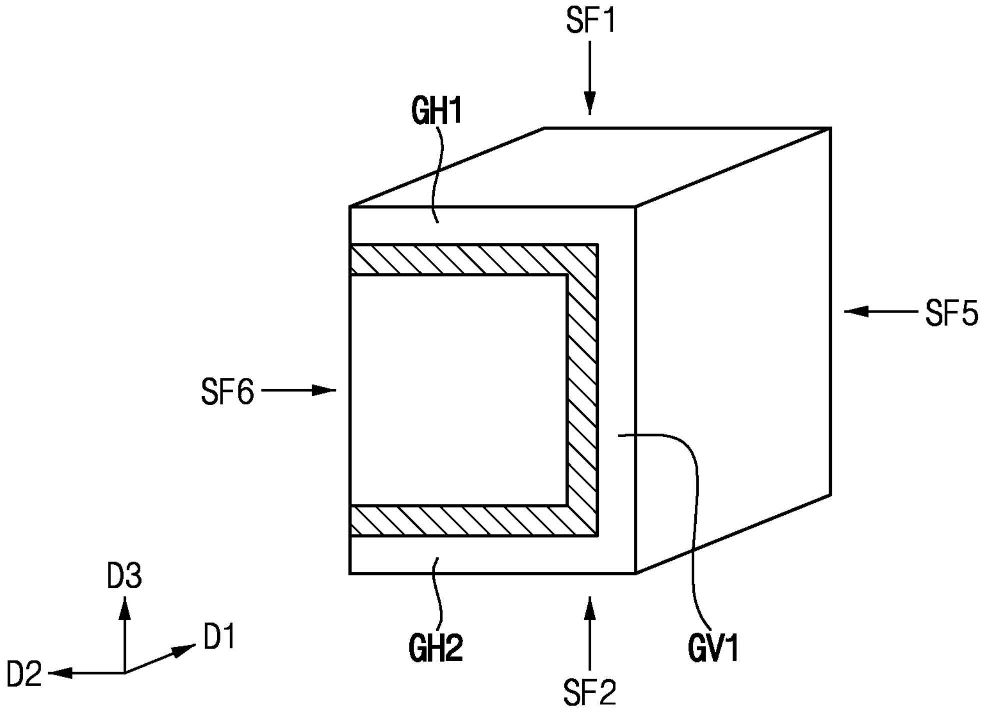
FIG. 7 is a diagram illustrating an example embodiment of a pass transistor having a three-face gate structure included in a memory device according to example embodiments.
Figure 8:
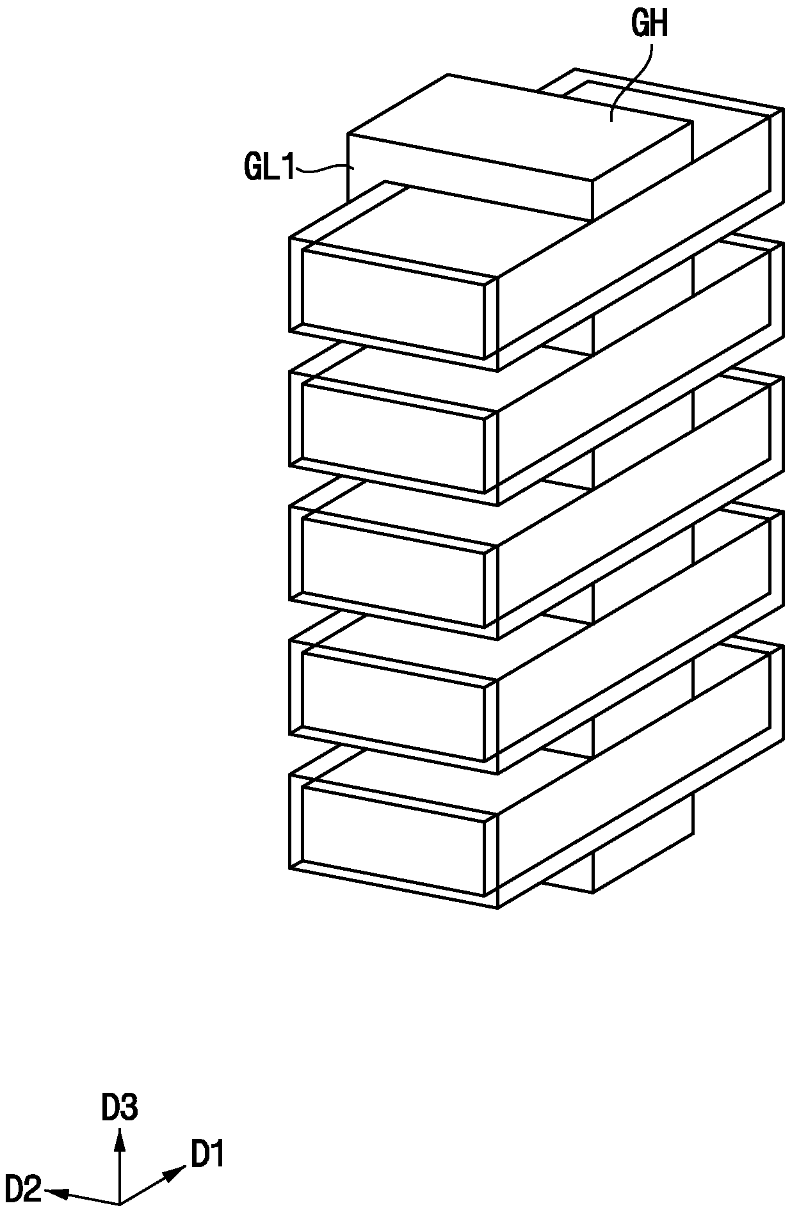
FIGS. 8 and 9 are diagrams illustrating an example embodiment of stacked pass transistors according to the three-face gate structure of FIG. 7.
Figure 9:
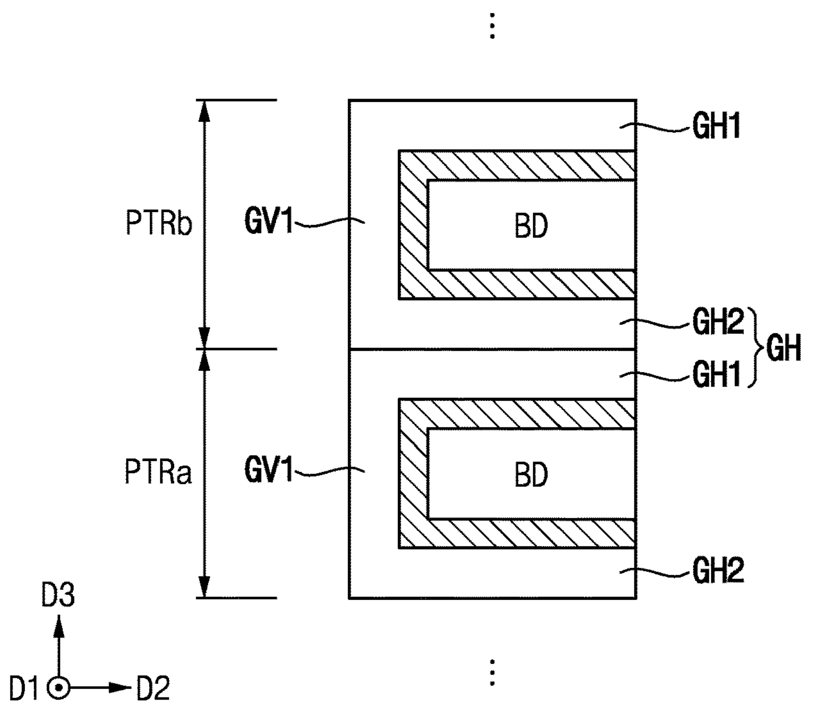

FIG. 7 is a diagram illustrating an example embodiment of a pass transistor having a three-face gate structure included in a memory device according to example embodiments, and FIGS. 8 and 9 are diagrams illustrating an example embodiment of stacked pass transistors according to the three-face gate structure of FIG. 7.

Referring to FIG. 7, each pass transistor PTR may include a first vertical gate electrode GV1 disposed on a first surface among the front surface SF5 and the rear surface SF6 of the body region BD, an upper horizontal gate electrode GH1 disposed on the upper surface SF1 of the body region BD and a lower horizontal gate electrode GH2 disposed on the lower surface SF2 of the body region BD. FIG. 7 shows an example in which the first surface corresponds to the front surface SF5. The upper horizontal gate electrode GH1 and the lower horizontal gate electrode GH2 may be connected to the first vertical gate electrode GV1.

A gate insulating layer GIF may be disposed between the first vertical gate electrode GV1 and the first surface SF5 of the body region BD, between the upper horizontal gate electrode GH1 and the upper surface SF1 of the body region BD and between the lower horizontal gate electrode GH2 and the lower surface SF2 of the body region BD. Therefore, when the block selection signal BS having a turn-on voltage level is applied to the first vertical gate electrode GV1 and the pass transistor PTR is turned on, a channel of the pass transistor PTR may be formed on the first surface SF5, the upper surface SF1 and the lower surface SF2 of the body region BD. For example, the channel width of the pass transistor PTR may correspond to a sum of twice the length of the body region BD in the vertical direction D3 and the length of the body region BD in the second horizontal direction D2, and the channel length of the pass transistor PTR may correspond to the length of the body region BD in the first horizontal direction D1.

FIG. 8 shows a structure in which five pass transistors PTR having the three-face gate structure of FIG. 7 are stacked. The five first vertical gate electrodes GV1 corresponding to the five pass transistors PTR may form a first gate line GL1 extending in the vertical direction D3.

Although FIG. 8 illustrates a structure corresponding to the five pass transistors PTR is shown in FIG. 8, embodiments are not limited thereto. For example, in some embodiments the first gate line GL1 may extend in the vertical direction D3 to correspond to the number of wordlines WL. For example, the first vertical gate electrodes GV1 respectively included in the plurality of pass transistors PTR of each pass transistor block PTB may form the first gate lines GL1 extending in the vertical direction D3. The upper horizontal gate electrodes GH1 and the lower horizontal gate electrodes GH2 respectively included in the plurality of pass transistors PTR of each pass transistor block PTB may be connected to the first gate line GL1. As a result, the plurality of pass transistors PTR included in each pass transistor block PTB may be simultaneously switched based on the block select signal BS applied to the first gate line GL1.

FIG. 9 shows a cross-sectional structure corresponding to two adjacent pass transistors PTRa and PTRb in the vertical direction D3. As illustrated in FIG. 9, the upper horizontal gate electrode GH1 of one pass transistor PTRa and the lower horizontal gate electrode GH2 of another pass transistor PTRb, which may be adjacent to the one pass transistor PTRa in the vertical direction D3, may be integrally formed as one conductor GH.

Figure 10:
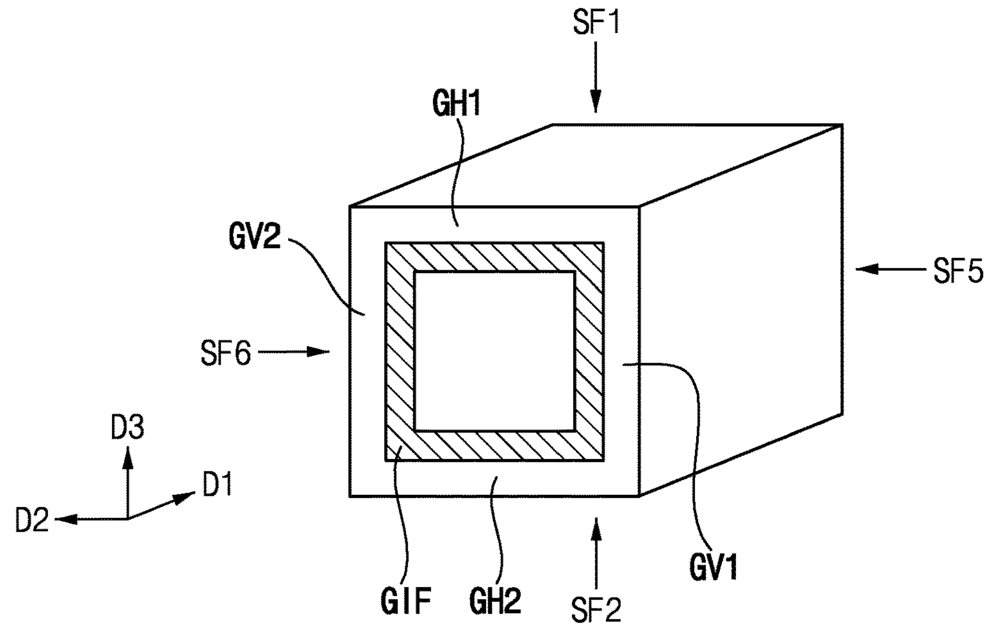
FIG. 10 is a diagram illustrating an example embodiment of a pass transistor having a four-face gate structure included in a memory device according to example embodiments.
Figure 11:
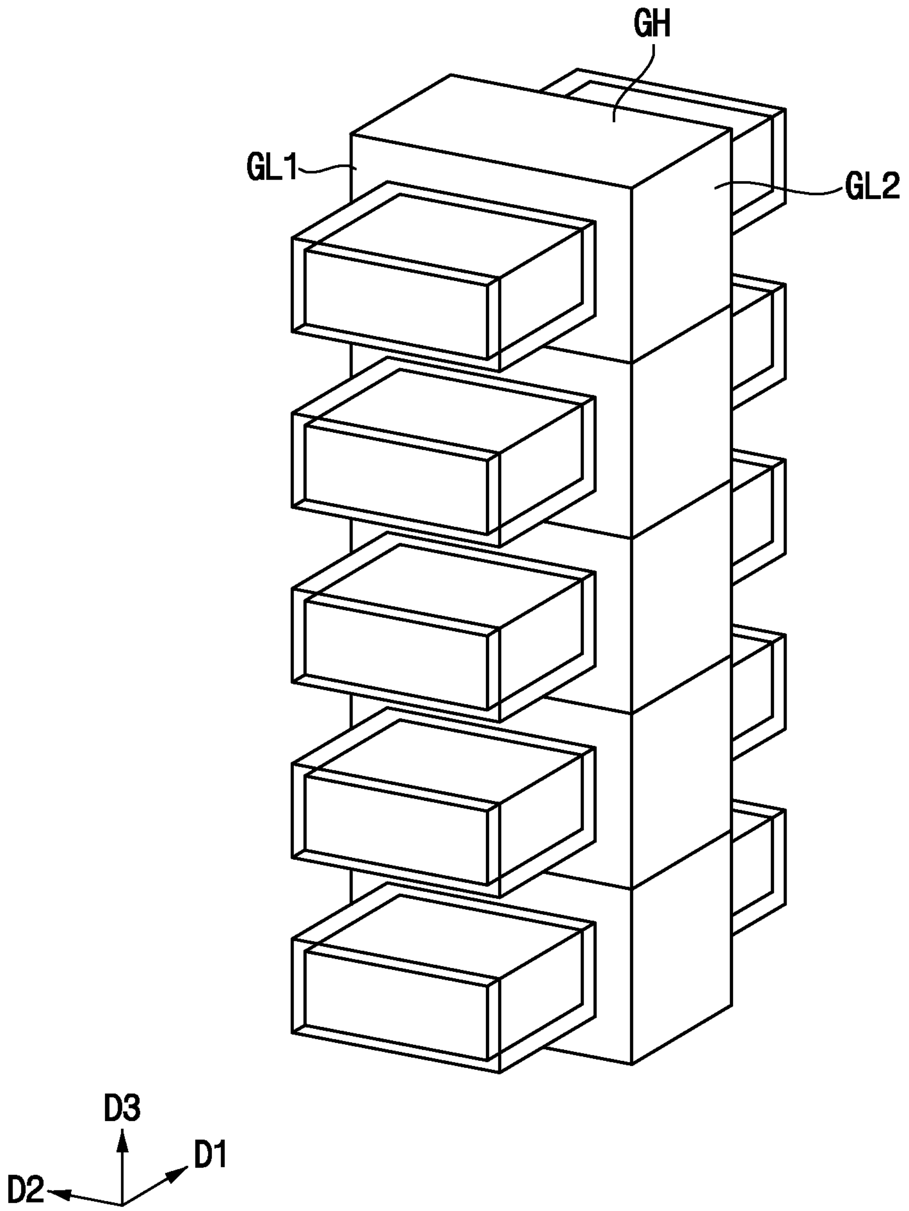
FIG. 11 is a diagram illustrating an example embodiment of stacked pass transistors according to the four-face gate structure of FIG. 10.

FIG. 10 is a diagram illustrating an example embodiment of a pass transistor having a four-face gate structure included in a memory device according to example embodiments, and FIG. 11 is a diagram illustrating an example embodiment of stacked pass transistors according to the four-face gate structure of FIG. 10.

Referring to FIG. 10, each pass transistor PTR may include a first vertical gate electrode GV1 disposed on a first surface among the front surface SF5 and rear surface SF6 of the body region BD, a second vertical gate electrode GV2 disposed on a second surface among the front surface SF5 and the rear surface SF6 of the body region BD, an upper horizontal gate electrode GH1 disposed on the upper surface SF1 of the body region BD, and a lower horizontal gate electrode GH2 disposed on the lower surface SF2 of the body region BD. FIG. 10 illustrates an example which the first surface corresponds to the front surface SF5 and the second surface corresponds to the rear surface SF6. The upper horizontal gate electrode GH1 and the lower horizontal gate electrode GH2 may be connected to the first vertical gate electrode GV1 and the second vertical gate electrode GV2.

A gate insulating layer GIF may be disposed between the first vertical gate electrode GV1 and the first surface SF5 of the body region BD, between the second vertical gate electrode GV2 and the second surface SF6 of the body region BD, between the upper horizontal gate electrode GH1 and the upper surface SF1 of the body region BD, and between the lower horizontal gate electrode GH2 and the lower surface SF2 of the body region BD. Therefore, when the pass transistor PTR is turned on by applying the block select signal BS having a turn-on voltage level to the first vertical gate electrode GV1 and the second vertical gate electrode GV2, a channel of the pass transistor PTR may be formed on the first surface SF5, the second surface SF6, the upper surface SF1 and the lower surface SF2. For example, the channel width of the pass transistor PTR may correspond to a sum of twice the length of the body region BD in the vertical direction D3 and twice the length of the body region BD in the second horizontal direction D2, and the channel length of the pass transistor PTR corresponds to the length of the body region BD in the first horizontal direction D1.

FIG. 11 illustrates a structure in which five pass transistors PTR having the four-face gate structure of FIG. 10 are stacked. The five first vertical gate electrodes GV1 corresponding to the five pass transistors PTR may form a first gate line GL1 extending in the vertical direction D3. Also, the five second vertical gate electrodes GV2 corresponding to the five pass transistors PTR may form a second gate line GL2 extending in the vertical direction D3.

Although FIG. 10 illustrates a structure corresponding to five pass transistors PTR, embodiments are not limited thereto. For example, in some embodiments the first gate line GL1 and the second gate line GL2 may be elongated in the vertical direction D3 to correspond to the number of wordlines WL. For example, the first vertical gate electrodes GV1 respectively included in the plurality of pass transistors PTR of each pass transistor block PTB may form the first gate lines GL1 extending in the vertical direction D3, and the second vertical gate electrodes GV2 respectively included in the plurality of pass transistors PTR of each pass transistor block PTB extending in the vertical direction D3 may form the second gate line GL2. As a result, the plurality of pass transistors PTR included in each pass transistor block PTB may be switched simultaneously based on the block select signal BS applied to the first gate line GL1 and the second gate line GL2.

In some embodiments, the two-face gate structure of FIG. 5 may have a larger channel width than the single-face gate structure of FIG. 3, the three-face gate structure of FIG. 7 may have a larger channel width than the two-face gate structure of FIG. 5, the four-face gate structure of FIG. 10 may have a larger channel width than the three-face gate structure of FIG. 7. As the channel width increases, the peak value of the channel current flowing along the first horizontal direction D1 may decrease. As the peak value of the channel current decreases, durability of the pass transistor PTR may be enhanced and lifespan may be extended. However, the two-face gate structure may have a more difficult manufacturing process than the single-face gate structure, the three-face gate structure may have a more difficult manufacturing process than the two-face gate structure, and the four-face gate structure may have a more difficult manufacturing process than the three-face gate structure. As such, because the performance of the pass transistor PTR and process difficulty may have a trade-off relationship, the trade-off relationship may be considered when determining which gate structure to use.

Figure 12:
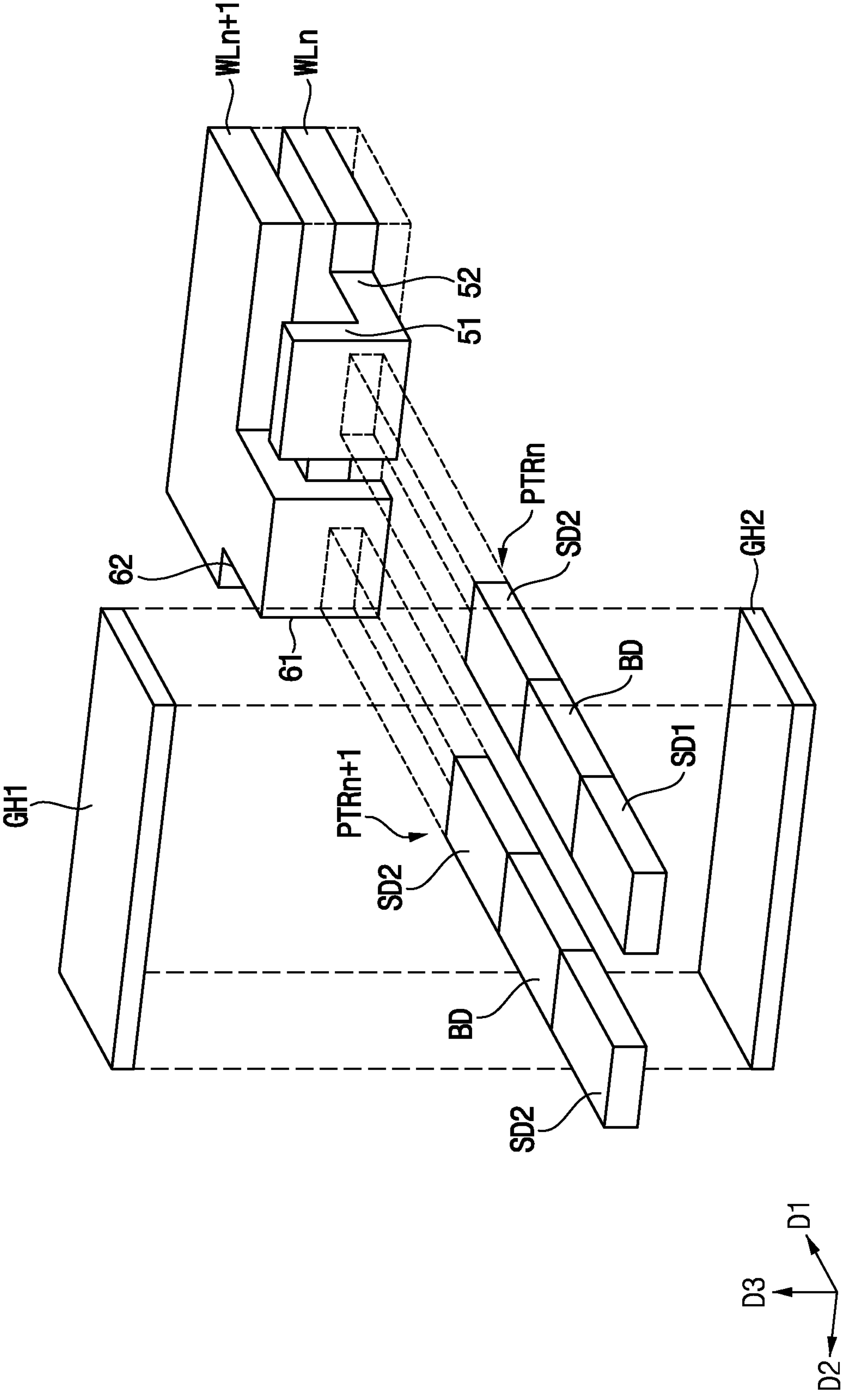
FIGS. 12 and 13 are diagrams illustrating an example embodiment of a connection structure of a pass transistor and a wordline included in a memory device according to example embodiments.
Figure 13:
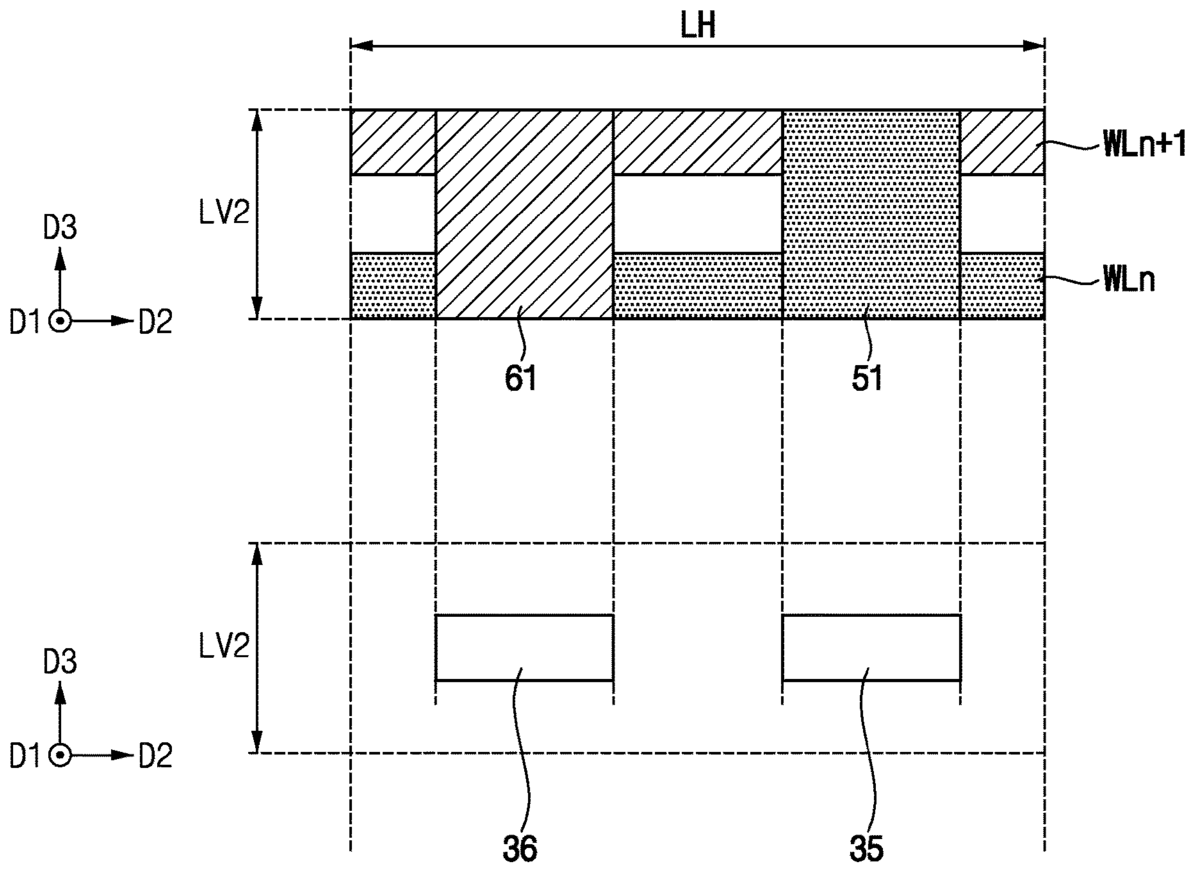

FIGS. 12 and 13 are diagrams illustrating an example embodiment of a connection structure of a pass transistor and a wordline included in a memory device according to example embodiments.

Referring to FIGS. 12 and 13, two pass transistors PTRn and PTRn+1 respectively connected to two wordlines WLn and WLn+1 that are adjacent to each other in the vertical direction D3 (where n is an integer greater than or equal to 0) may be adjacent to the two wordlines WLn and WLn+1 in the first horizontal direction D1 and arranged in the second horizontal direction D2. The upper horizontal gate electrode GH1 and the lower gate electrode GH2 may be disposed in common with body regions BD included in the two pass transistors PTRn and PTRn+1, respectively.

In some embodiments, the first vertical gate electrode GV1 and/or the second gate electrode GV2 as described above may be disposed on the first surface and/or the second surface of the body region BD of each of the pass transistors PTRn and PTRn+1. For example, each of the pass transistors PTRn and PTRn+1 may be implemented in the form of FIG. 3, 5, 7 or 10. As described above, the first vertical gate electrodes GV1 and/or the second gate electrodes GV2 of the pass transistors stacked in the vertical direction D3 may form the first gate line GL1 and/or the second gate line GL2 that are elongated in the vertical direction D3.

In this case, the memory device may further include two vertical connection conductors 51 and 61 connected to the second source-drain electrodes SD2 included in the two pass transistors PTRn and PTRn+1, respectively, and two horizontal connection conductors 52 and 62 connecting the two vertical connection conductors 51 and 61 and the two wordlines WLn and WLn+1, respectively.

The two vertical connection conductors 51 and 61 may be spaced apart from each other in the second horizontal direction D2. The two vertical connection conductors 51 and 61 may have the same horizontal length in the second horizontal direction D2 and the same vertical length in the vertical direction D3. For example, the horizontal connection conductors 52 connecting the wordline WLn and the vertical connection conductor 51 may be disposed close to one end of the wordline WLn in the second horizontal direction D2, and the horizontal connection conductors 62 connecting the wordline WLn+1 and the vertical connection conductor 52 may be disposed close to one end of the wordline WLn+1 in the second horizontal direction D2.

The two second source-drain electrodes 35 and 36 connected to the two vertical connection conductors 51 and 61 and respectively included in the two pass transistors PTRn and PTRn+1 are shown together at the bottom of FIG. 13. The two pass transistors PTRn and PTRn+1 may be disposed such that they do not exceed the horizontal size LH and the vertical size LV2 corresponding to the two wordlines WLn and WLn+1. The two second source-drain electrodes 35 and 36 may be disposed at any position in the vertical direction D3 that may join the two vertical connection conductors 51 and 61.

Although only the structure corresponding to the two wordlines WLn and WLn+1 has been described referring to FIGS. 12 and 13, the same structure may be repeated in the vertical direction D3.

Figure 14:
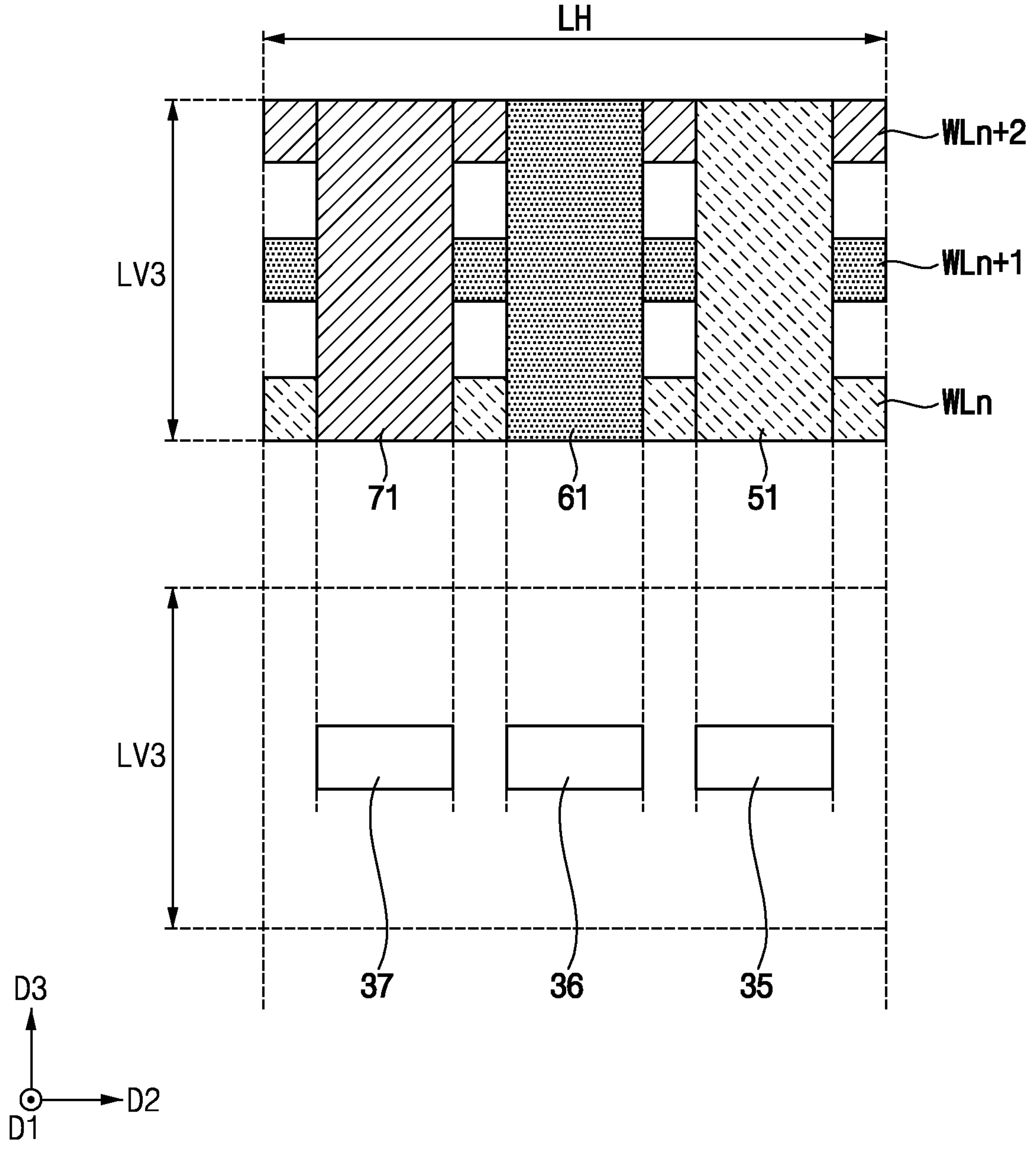
FIG. 14 is a diagram illustrating an example embodiment of a connection structure of a pass transistor and a wordline included in a memory device according to example embodiments.

FIG. 14 is a diagram illustrating an example embodiment of a connection structure of a pass transistor and a wordline included in a memory device according to example embodiments.

Referring to FIG. 14, three pass transistors respectively connected to three wordlines WLn, WLn+1, and WLn+2 that are adjacent to each other in the vertical direction D3 (where n is an integer greater than or equal to 0) may be adjacent to the lines WLn, WLn+1, and WLn+2 in the first horizontal direction D1 and arranged in the second horizontal direction D2.

In this case, the memory device may include three vertical connection conductors 51, 61, and 71 connected to the second source-drain electrodes SD2 included in the three pass transistors, respectively, and three horizontal connection conductors (not shown) connecting the three vertical connection conductors 51, 61 and 71 and the three wordlines WLn and WLn+1, respectively.

The three vertical connection conductors 51, 61, and 71 are spaced apart from each other in the second horizontal direction D2. The three vertical connection conductors 51, 61, and 71 may have the same horizontal length in the second horizontal direction D2 and the same vertical length in the vertical direction D3. For example, the horizontal connection conductor connecting the wordline WLn and the vertical connection conductor 51 may be disposed close to one end of the wordline WLn in the second horizontal direction D2, the horizontal connection conductor connecting the wordline WLn+1 and the vertical connection conductor 61 may be disposed at the center of the wordline WLn+1 in the second horizontal direction D2, and the horizontal connection conductor connecting the wordline WLn+2 and the vertical connection conductor 71 may be disposed close to the other end of the wordline WLn+2 in the second horizontal direction D2.

The three second source-drain electrodes 35, 36 and 37 respectively connected to three vertical connection conductors 51, 61, and 71 and respectively included in three pass transistors are shown together at the bottom of FIG. 14. Three pass transistors may be arranged such that they do not exceed the horizontal size LH and the vertical size LV3 corresponding to the three wordlines WLn, WLn+1 and WLn+2. The three second source-drain electrodes 35, 36 and 37 may be disposed at any position in the vertical direction D3 that may be joined to the three vertical connection conductors 51, 61 and 71.

Although the example embodiments illustrated in FIGS. 12 and 13 include two wordlines which are grouped and two pass transistors which are arranged in the second horizontal direction D2, and the example embodiments illustrated in FIG. 14 include three wordlines which are grouped and three pass transistors which are arranged in the second horizontal direction D2, embodiments are not limited thereto. For example, in some embodiments the number of grouped wordlines may be variously determined.

According to example embodiments, as described with reference to FIGS. 12, 13 and 14, k pass transistors (where k is an integer greater than one) of the plurality of pass transistors respectively connected to k wordlines of the plurality of wordlines adjacent to each other in the vertical direction D3 may be adjacent in the first horizontal direction D1 and may be arranged in the second horizontal direction D2. In this case, the memory device may further include k vertical connection conductors respectively connected to the second source-drain electrodes of the k pass transistors, and k horizontal connection conductors respectively connecting the k vertical connection conductors and the k wordlines. The k vertical connection conductors may be arranged spaced apart from each other in the second horizontal direction D2, may have a same horizontal length in the second horizontal direction D2, and may have a same vertical length in the vertical direction D3.

Figure 15:
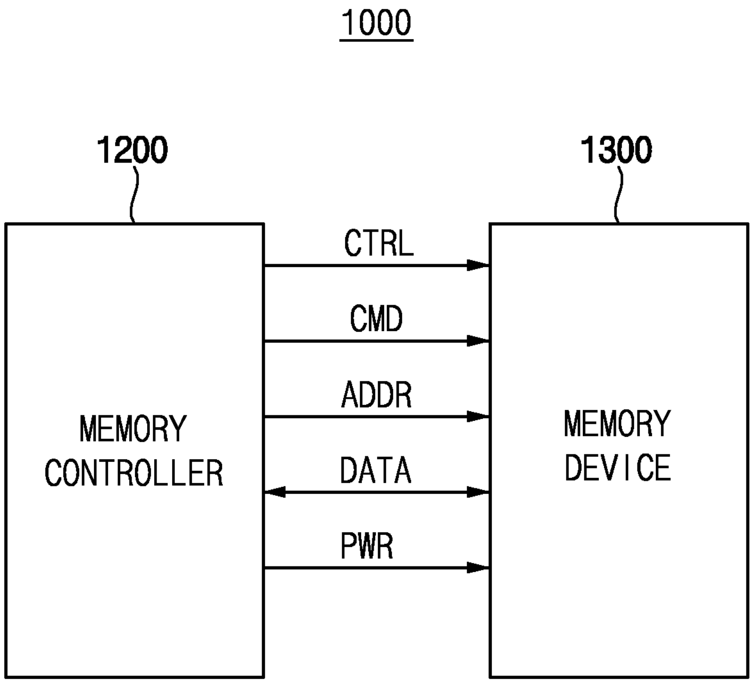
FIG. 15 is a block diagram illustrating a memory system according to example embodiments.

FIG. 15 is a block diagram illustrating a memory system according to example embodiments.

Referring to FIG. 15, a memory system 1000 may include a memory controller 1200 and at least one memory device 1300. The memory device 1300 may be a nonvolatile memory device as described herein. The memory system 1000 may include data storage media based on a flash memory such as, but not limited to, a memory card, a universal serial bus (USB) memory, and a solid state drive (SSD).

The memory device 1300 may perform one or more operations under control of the memory controller 1200. The one or more operations may include, but are not limited to, a read operation, an erase operation, a program operation, and a write operation. The memory device 1300 may receive a command CMD (e.g., a read command and/or a write command), an address ADDR (e.g., a read address and/or a write address) and data DATA through input/output lines from the memory controller 1200 for performing such operations. In some embodiments, the memory device 1300 may receive a control signal CTRL through a control line from the memory controller 20. In some embodiments, the memory device 1300 may receive a power PWR through a power line from the memory controller 1200.

Hereinafter, example embodiments are described with respect to a case in which the above-described memory device is a non-volatile memory device, for example a three-dimensional (3D) NAND or vertical NAND flash memory device. However, embodiments are not limited to a specific type of memory device and may be applied to any memory device in which a plurality of wordlines are stacked in a vertical direction.

Figure 16:
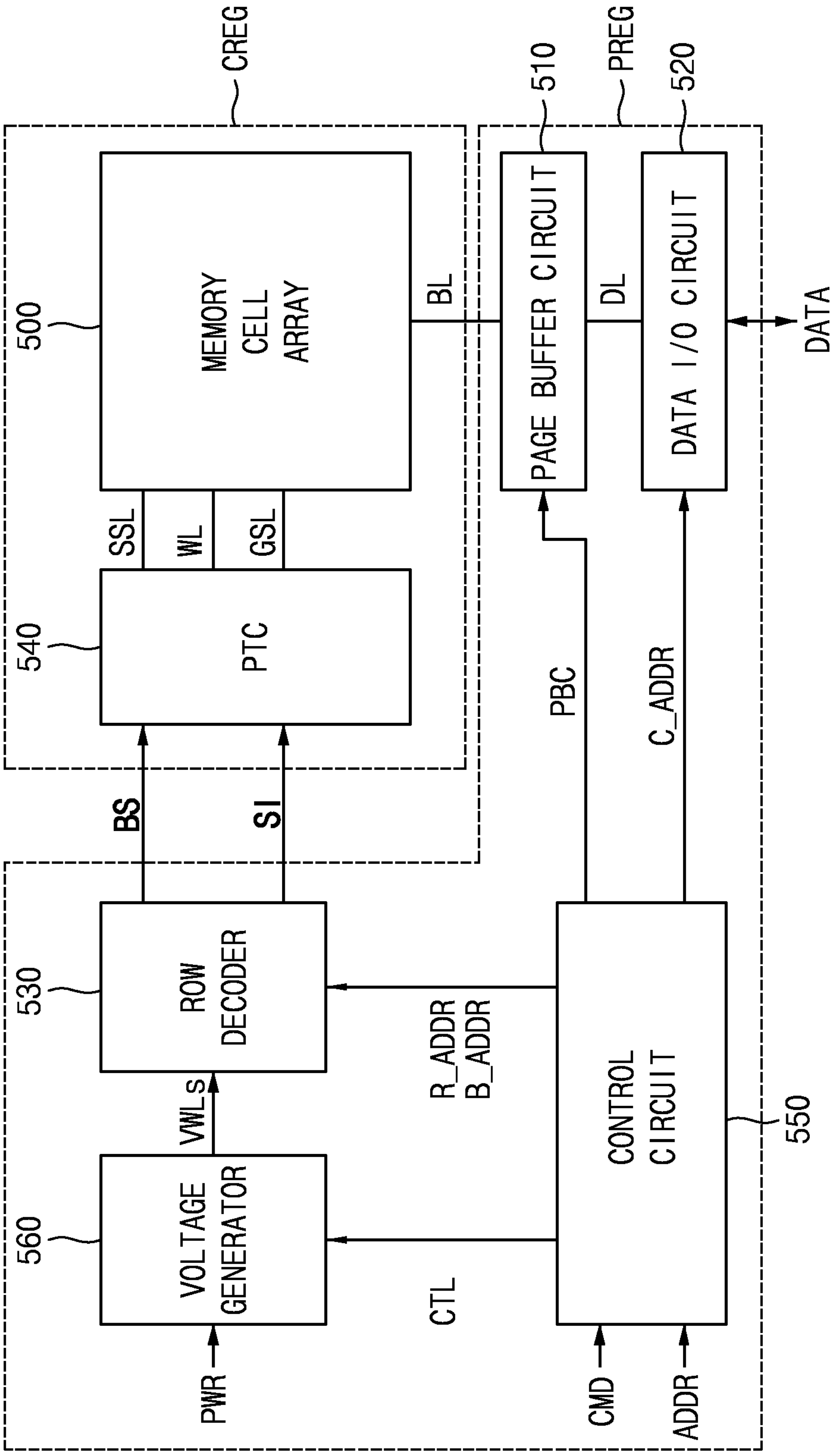
FIG. 16 is a block diagram illustrating a nonvolatile memory device according to example embodiments.

FIG. 16 is a block diagram illustrating a nonvolatile memory device according to example embodiments.

Referring to FIG. 16, a nonvolatile memory device 1300 may include a memory cell array 500, a page buffer circuit 510, a data input/output (I/O) circuit 520, a row decoder 530, a pass transistor circuit PTC 540, a control circuit 550 and a voltage generator 560. In some embodiments, the memory cell array 500 and the pass transistor circuit 540 may be disposed in a cell region (e.g., cell region CREG of FIG. 25), and the page buffer circuit 510, the data I/O circuit 520, the row decoder 530, the control circuit 550 and the voltage generator 560 may be disposed in a peripheral region (e.g., peripheral region PREG of FIG. 25).

The memory cell array 500 may be coupled to the row decoder 530 through string selection lines SSL, wordlines WL, and ground selection lines GSL. In some embodiments, the memory cell array 500 may be coupled to the page buffer circuit 510 through bitlines BL. The memory cell array 500 may include a plurality of memory blocks and each memory block may include memory cells coupled to the wordlines WL and the bitlines BL. In some example embodiments, the memory cell array 500 may be a three-dimensional memory cell array, which may be formed on a substrate in a three-dimensional structure (e.g., a vertical structure). For example, the memory cell array 500 may include cell strings (e.g., NAND strings) that are vertically oriented such that at least one memory cell is overlapped vertically with another memory cell.

The control circuit 550 may receive a command CMD (e.g., a command signal) and an address ADDR (e.g., an address signal) from a memory controller (e.g., memory controller 1200 of FIG. 15). Accordingly, the control circuit 550 may control erase, program, and/or read operations of the nonvolatile memory device 1000 in response to (and/or based on) at least one of the command signal CMD and the address signal ADDR. An erase operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 550 may generate the control signals CTL used to control the operation of the voltage generator 560, and may generate the page buffer control signal PBC for controlling the page buffer circuit 510 based on the command signal CMD. In some embodiments, the control circuit 550 may generate the block address B_ADDR, the row address R_ADDR and the column address C_ADDR based on the address signal ADDR. The control circuit 550 may provide the block address B_ADDR and the row address R_ADDR to the row decoder 530 and provide the column address C_ADDR to the data I/O circuit 520.

The pass transistor circuit 540 may be connected to the memory cell array 500 through a plurality of string selection lines SSL, a plurality of wordlines WL and a plurality of ground selection lines GSL.

During the program operation and/or the read operation, the row decoder 530 may determine and/or select one of the memory blocks as a selected memory block and determine the remaining memory blocks except for the selected memory block as unselected memory blocks based on the block address B_ADDR. The row decoder 530 may provide block selection signals BS corresponding to the selected memory block to the pass transistor circuit 540. In addition, the row decoder 530 may determine one of the wordlines WL as a selected wordline and determine the remaining wordlines WL except for the selected wordline as unselected wordlines based on the row address R_ADDR. The row decoder 530 may provide driving signals SI corresponding to the selected wordline to the pass transistor circuit 540. In addition, the row decoder 530 may determine one of the string selection lines SSL as a selected string selection line and determine rest of the string selection lines SSL except for the selected string selection line as unselected string selection lines based on the row address R_ADDR. In addition, the row decoder 530 may determine one of the ground selection lines GSL as a selected ground selection line and determine rest of the string selection lines SSL except for the selected string selection line as unselected string selection lines based on the row address R_ADDR.

The voltage generator 560 may generate wordline voltages VWL, which may be used during the operation of the memory cell array 500 of the nonvolatile memory device 1000, based on the control signals CTL. The voltage generator 560 may receive power PWR from the memory controller. The wordline voltages VWL may be applied to the wordlines WL through the row decoder 530.

For example, during the erase operation, the voltage generator 560 may apply an erase voltage to a well and/or a common source line of a memory block and apply an erase permission voltage (e.g., a ground voltage) to all or a portion of the wordlines of the selected memory block based on an erase address. During the erase verification operation, the voltage generator 560 may apply an erase verification voltage simultaneously to all of the wordlines of the selected memory block or sequentially (e.g., one by one) to the wordlines.

As another example, during the program operation, the voltage generator 560 may apply a program voltage to the selected wordline and may apply a program pass voltage to the unselected wordlines. In addition, during the program verification operation, the voltage generator 560 may apply a program verification voltage to the first wordline and may apply a verification pass voltage to the unselected wordlines.

During the normal read operation, the voltage generator 560 may apply a read voltage to the selected wordline and may apply a read pass voltage to the unselected wordlines. During the data recover read operation, the voltage generator 560 may apply the read voltage to a wordline adjacent to the selected wordline and may apply a recover read voltage to the selected wordline.

The page buffer circuit 510 may be coupled to the memory cell array 500 through the bitlines BL. The page buffer circuit 510 may include multiple buffers. In some example embodiments, each buffer may be connected to a single bitline. In some embodiments, each buffer may be connected to two or more bitlines. The page buffer circuit 510 may temporarily store data to be programmed in a selected page or data read out from the selected page of the memory cell array 500.

The data I/O circuit 520 may be coupled to the page buffer circuit 510 through data lines DL. During the program operation, the data I/O circuit 520 may receive program data DATA received from the memory controller and provide the program data DATA to the page buffer circuit 510 based on the column address C_ADDR received from the control circuit 550. During the read operation, the data I/O circuit 520 may provide read data DATA, having been read from the memory cell array 500 and stored in the page buffer circuit 510, to the memory controller based on the column address C_ADDR received from the control circuit 550.

In some embodiments, the page buffer circuit 510 and the data I/O circuit 520 may read data from a first area of the memory cell array 500 and write the read data to a second area of the memory cell array 500 (e.g., without transmitting the data to a source external to the nonvolatile memory device 1000, such as to the memory controller 1200 of FIG. 15). For example, the page buffer circuit 510 and the data I/O circuit 520 may perform a copy-back operation.

Figure 17:
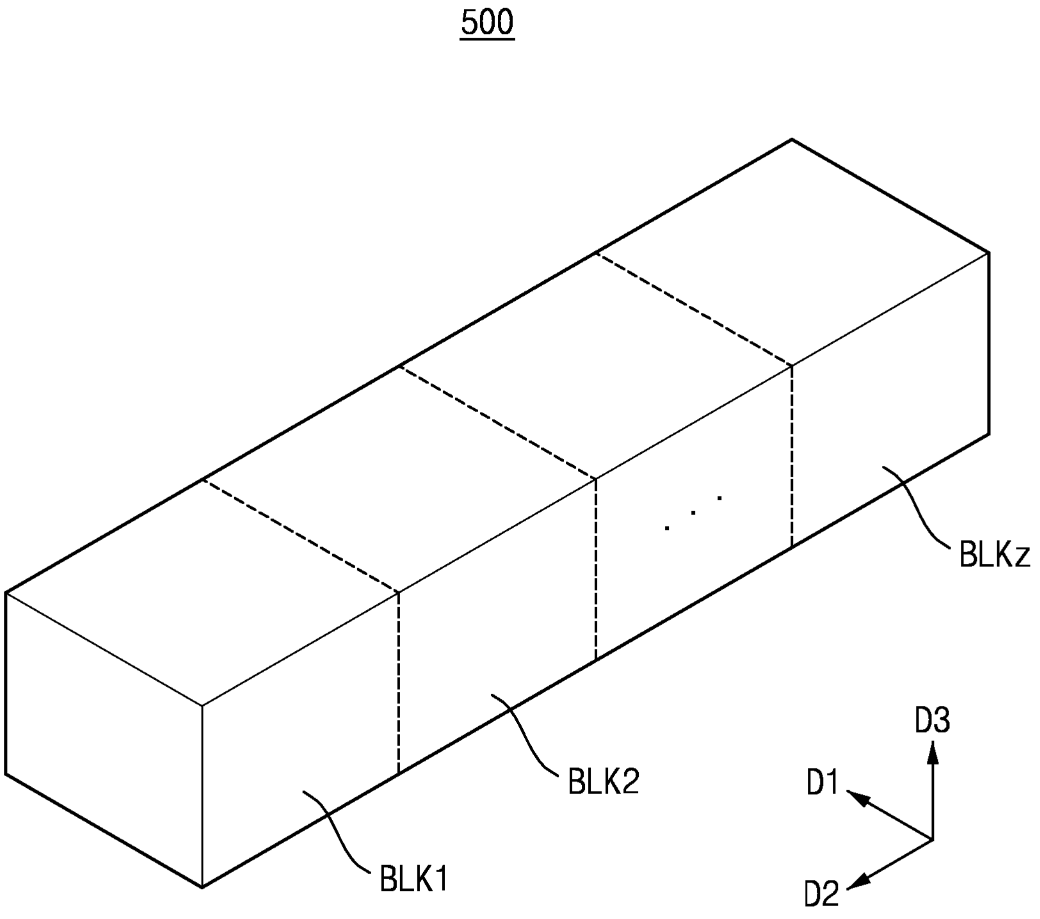
FIG. 17 is a block diagram illustrating a memory cell array included in the nonvolatile memory device of FIG. 16.
Figure 18:
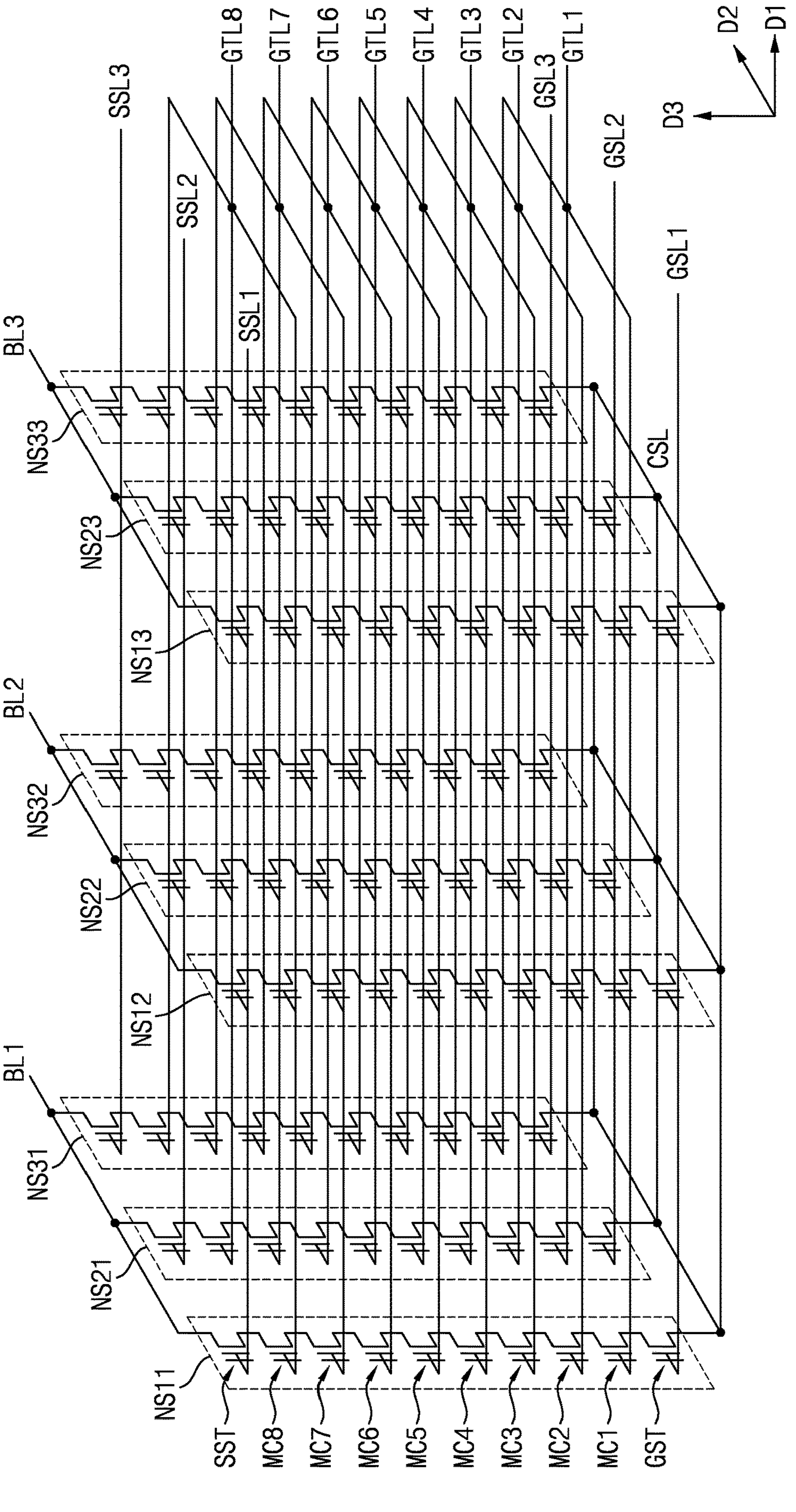
FIG. 18 is a circuit diagram illustrating an equivalent circuit of a memory block included in the memory cell array of FIG. 17.

FIG. 17 is a block diagram illustrating a memory cell array included in the nonvolatile memory device of FIG. 16, and FIG. 18 is a circuit diagram illustrating an equivalent circuit of a memory block included in the memory cell array of FIG. 17.

Referring to FIG. 17, the memory cell array 500 may include memory blocks BLK1 to BLKz, where z is an integer greater than 1. In some example embodiments, the memory blocks BLK1 to BLKz may be selected by the row decoder 530 of FIG. 16. For example, the row decoder 530 may select a particular memory block corresponding to a block address B_ADDR as the selected memory block among the memory blocks BLK1 to BLKz.

The memory block BLKi of FIG. 18 (where i is an integer between 1 and z) may be formed on a semiconductor substrate in a three-dimensional structure (e.g., a vertical structure). For example, NAND strings and/or cell strings included in the memory block BLKi may be disposed in the vertical direction D3 perpendicular to the upper surface of the substrate.

Referring to FIG. 18, the memory block BLKi may include cell strings and/or NAND strings NS11 to NS33 coupled between bitlines BL1, BL2 and BL3 and a common source line CSL. Each NAND string may include a plurality of memory cells stacked in the vertical direction D3, and the plurality of wordlines may be stacked in the vertical direction D3.

Each of the NAND strings NS11 to NS33 may include a string selection transistor SST, memory cells MC1 to MC8, and a ground selection transistor GST. In FIG. 18, each of the NAND strings NS11 to NS33 is illustrated to include eight memory cells MC1 to MC8. However, the present disclosure is not limited in this regard. For example, in some embodiments, each of the NAND strings NS11 to NS33 may include any number of memory cells.

Each string selection transistor SST may be connected (e.g., communicatively coupled) to a corresponding string selection line (e.g., one of SSL1 to SSL3). The memory cells MC1 to MC8 may be connected to corresponding gate lines GTL1 to GTL8, respectively. The gate lines GTL1 to GTL8 may be wordlines, and some of the gate lines GTL1 to GTL8 may be dummy wordlines. Each ground selection transistor GST may be connected to a corresponding ground selection line (e.g., one of GSL1 to GSL3). Each string selection transistor SST may be connected to a corresponding bitline (e.g., one of BL1, BL2 and BL3), and each ground selection transistor GST may be connected to the common source line CSL.

The wordline (e.g., each of the gate lines GTL1 to GTL8) having the same height may be commonly connected, and the ground selection lines GSL1 to GSL3 and the string selection lines SSL1 to SSL3 may be separated. In FIG. 18, the memory block BLKi is illustrated to be coupled to eight gate lines GTL1 to GTL8 and three bitlines BL1 to BL3. However, the embodiments are not limited thereto. For example, in some embodiments each memory block in the memory cell array 500 may be coupled to any number of wordlines and any number of bitlines.

Figure 19:
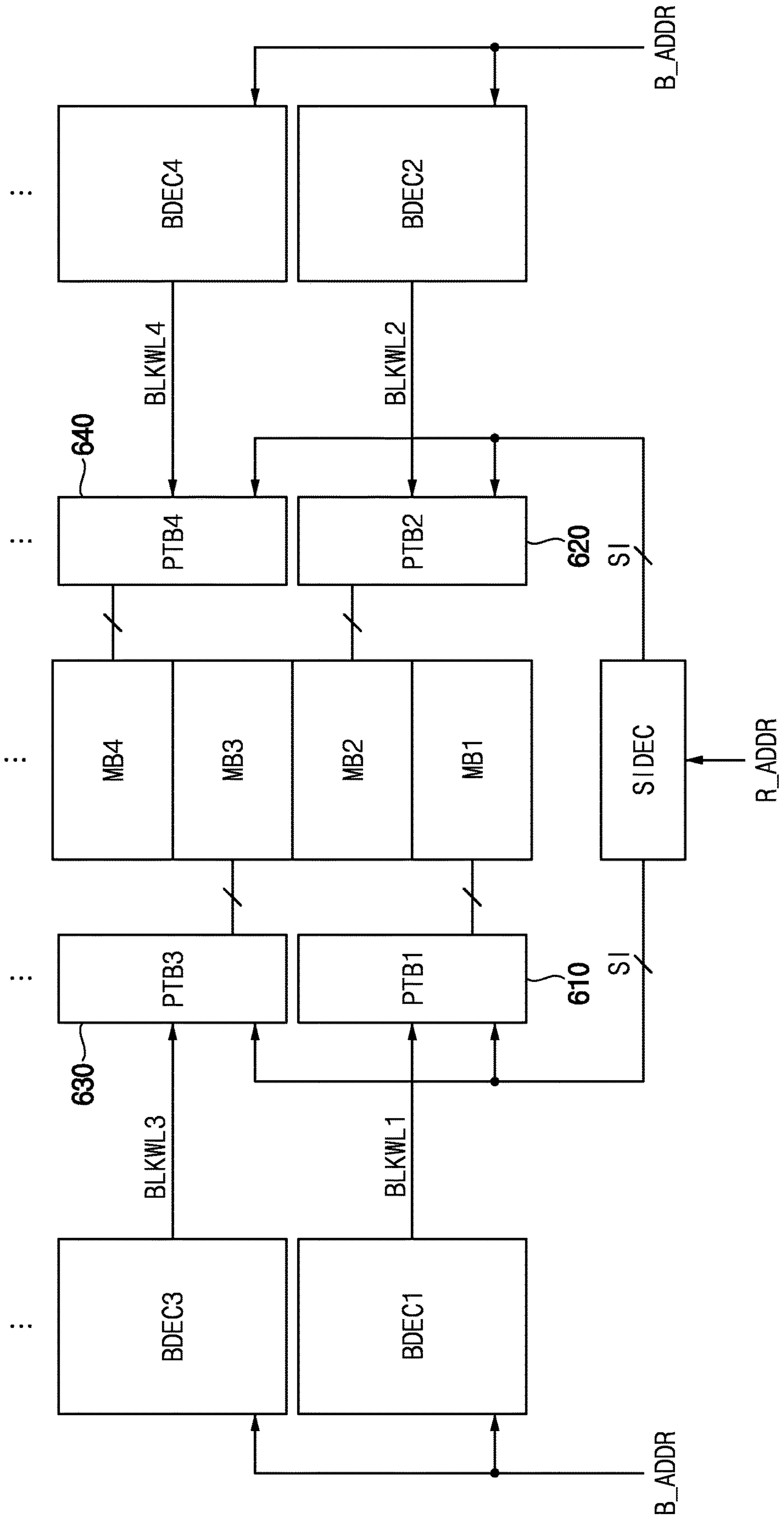
FIG. 19 is a block diagram illustrating an example embodiment of a row decoder and a pass transistor circuit included in a nonvolatile memory device according to example embodiments.

FIG. 19 is a block diagram illustrating an example embodiment of a row decoder and a pass transistor circuit included in a nonvolatile memory device according to example embodiments. FIG. 19 illustrates four memory blocks, for example first through fourth memory blocks MB1 to MB4, and a corresponding configuration of the row decoder 530 for convenience of illustration and description. However, embodiments are not limited to a particular number of memory blocks.

Referring to FIG. 19, the row decoder 530 may include a driving signal decoder SIDEC, first through fourth block decoders BDEC1 to BDEC4, and first through fourth pass transistor blocks 610 to 640 corresponding to the first through fourth memory blocks MB1 to MB4. As illustrated in FIG. 19, the first pass transistor block 610 is labeled PTB1, the second pass transistor block 620 is labeled PTB2, the third pass transistor block 630 is labeled PTB3, and the fourth pass transistor block 640 is labeled PTB4.

The driving signal decoder SIDEC may generate driving signals SI based on the row address R_ADDR. The driving signal decoder SIDEC may determine voltage levels of the driving signals SI corresponding to the program operation, the read operation, and/or the erase operation.

The first through fourth block decoders BDEC1 to BDEC4 may generate block selection signals to select one memory block based on the block address B_ADDR.

The first block decoder BDEC1 may generate a block selection signal BLKWL1 corresponding to the first memory block MB1. The second block decoder BDEC2 may generate a block selection signal BLKWL2 corresponding to the second memory block MB2. The third block decoder BDEC3 may generate a block selection signal BLKWL3 corresponding to the third memory block MB3. The fourth block decoder BDEC4 may generate a block selection signal BLKWL4 corresponding to the fourth memory block MB4.

The first through fourth pass transistor blocks 610, 620, 630 and 640 may control transfer of the driving signals SI to the corresponding memory block based on the corresponding block selection signal.

The first pass transistor block 610 may control the transfer of the driving signals SI to the first memory block MB1 based on the block selection signal BLKWL1. The second pass transistor block 620 may control the transfer of the driving signals SI to the second memory block MB2 based on the block selection signal BLKWL2. The third pass transistor block 630 may control the transfer of the driving signals SI to the third memory block MB3 based on the block selection signal BLKWL3. The fourth pass transistor block 640 may control the transfer of the driving signals SI to the fourth memory block MB4 based on the block selection signal BLKWL4.

Figure 20:
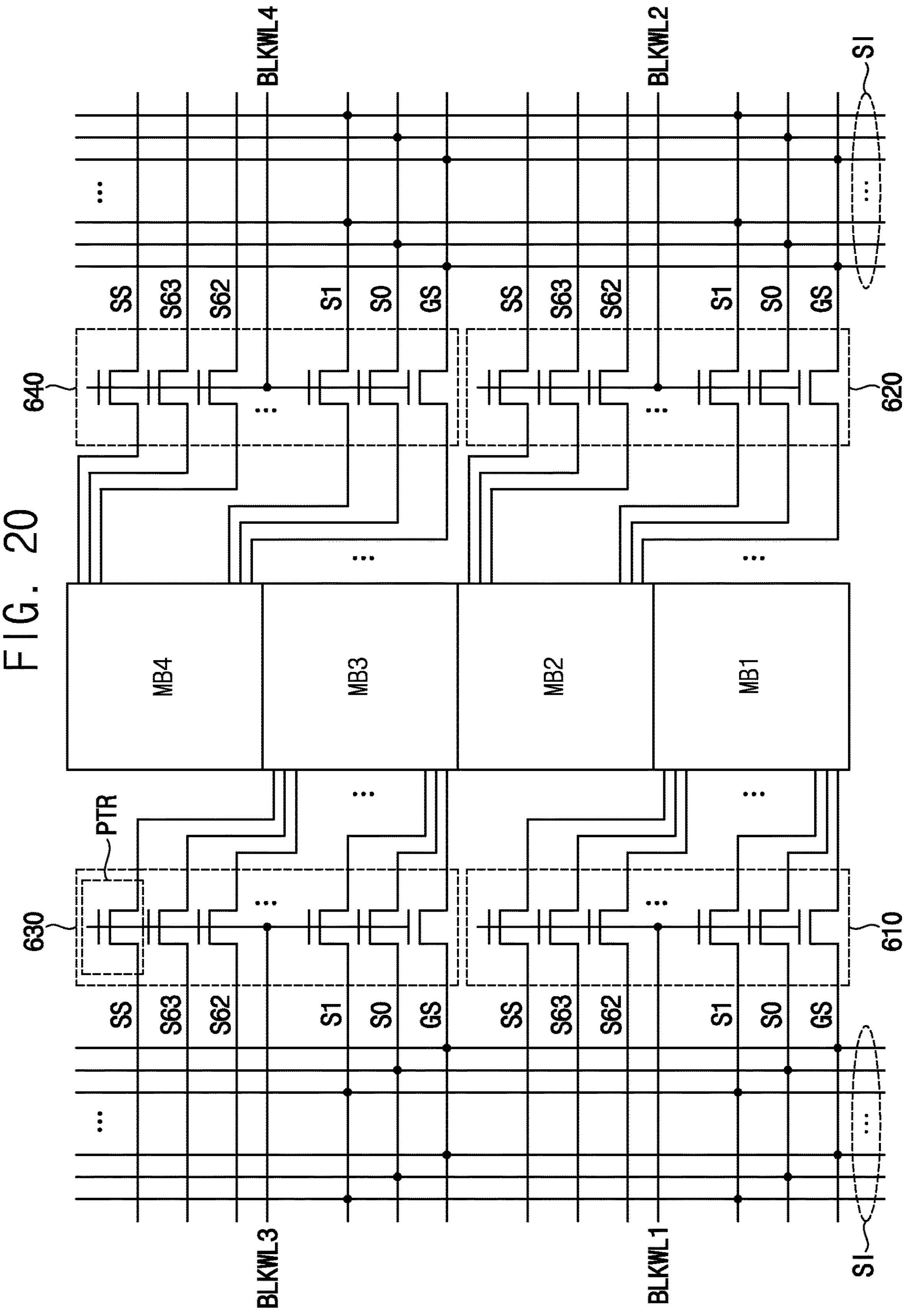
FIG. 20 is a diagram illustrating an example embodiment of a pass transistor circuit of FIG. 19.

FIG. 20 is a diagram illustrating an example embodiment of a pass transistor circuit of FIG. 19.

Referring to FIG. 20, the driving signals SI may be transferred selectively to the first through fourth memory blocks MB1 to MB4 by the first through fourth pass transistor blocks 610, 620, 630 and 640.

When the first memory block MB1 is selected based on the block address, the block selection signal BLKWL1 provided from the first block decoder BDEC1 may be activated such that all of the pass transistors PTR in the first pass transistor block 610 may be turned on. Accordingly, the driving signals SI including a ground selection signal GS, a string selection signal SS, and wordline driving signals S0 to S63 may be transferred to the first memory block MB1. The driving signals GS, SS, and S0 to S63 may be provided to the gates (e.g., the wordlines) of the selection transistors and the memory cells in the first memory block MBT.

When the second memory block MB2 is selected based on the block address, the block selection signal BLKWL2 provided from the second block decoder BDEC2 may be activated such that all of the pass transistors PTR in the second pass transistor block 620 may be turned on. Accordingly, the driving signals GS, SS, and S0 to S63 may be transferred to the second memory block MB2. The driving signals GS, SS, and S0 to S63 may be provided to the gates of the selection transistors and the memory cells in the second memory block MB2.

When the third memory block MB3 is selected based on the block address, the block selection signal BLKWL3 provided from the third block decoder BDEC3 may be activated such that all of the pass transistors PTR in the third pass transistor block 630 may be turned on. Accordingly, the driving signals GS, SS, and S0 to S63 may be transferred to the third memory block MB3. The driving signals GS, SS, and S0 to S63 may be provided to the gates of the selection transistors and the memory cells in the third memory block MB3.

When the fourth memory block MB4 is selected based on the block address, the block selection signal BLKWL4 provided from the fourth block decoder BDEC4 may be activated such that all of the pass transistors PTR in the fourth pass transistor block 640 may be turned on. Accordingly, the driving signals GS, SS, and S0 to S63 may be transferred to the fourth memory block MB4. The driving signals GS, SS, and S0 to S63 may be provided to the gates of the selection transistors and the memory cells in the fourth memory block MB4.

As illustrated in FIG. 20, each of the first through fourth pass transistor blocks 610, 620, 630 and 640 may include a plurality of pass transistors PTR as described above.

In some example embodiments, the pass transistor PTR corresponding to the string select signal SS and/or the pass transistor PTR corresponding to the ground select signal GS may not be included in the stacked structure of the pass transistors described above, but may be formed in the peripheral circuit region PREG.

Figure 21:
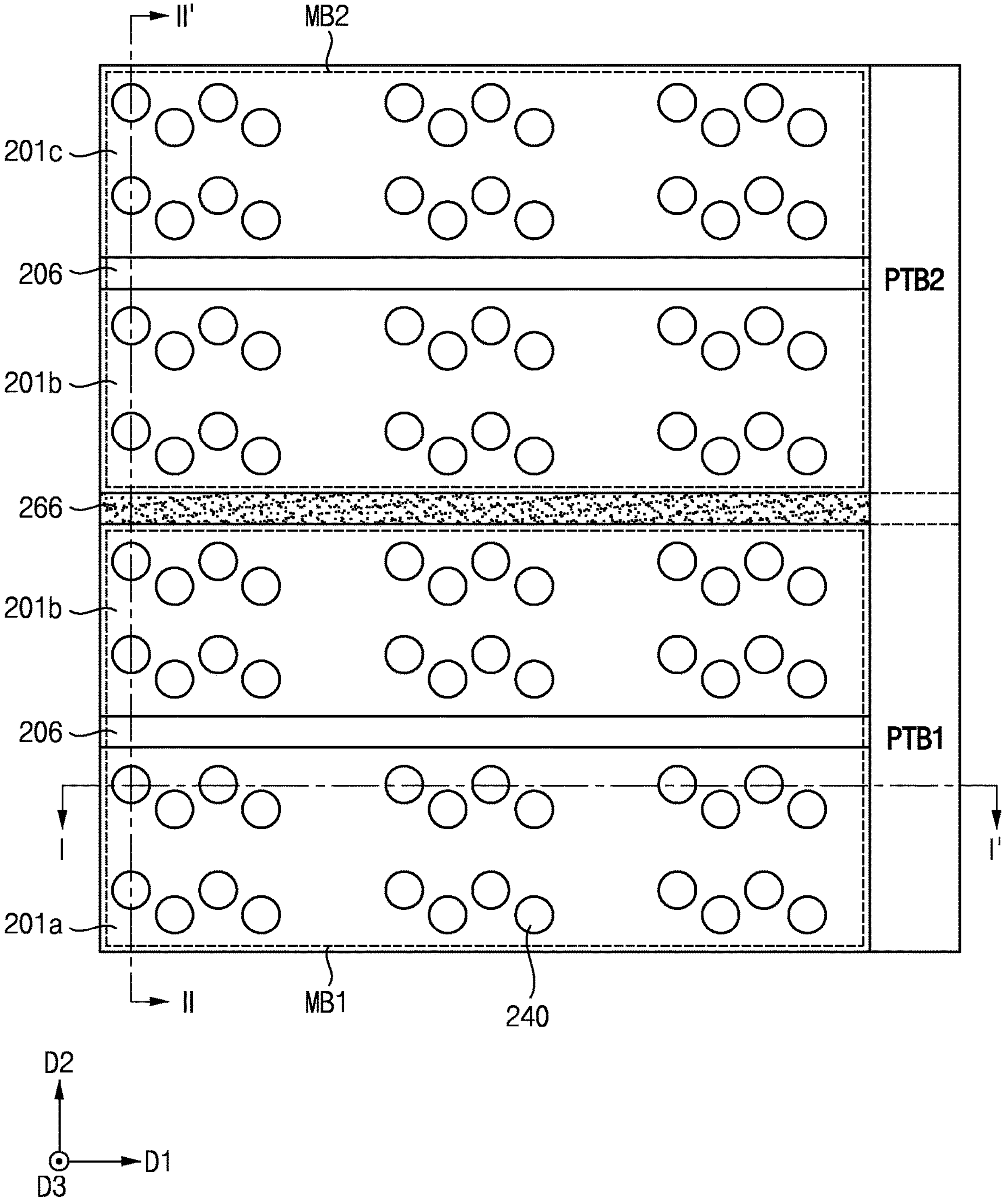
FIG. 21 is a top view of a memory device according to example embodiments.
Figure 22:
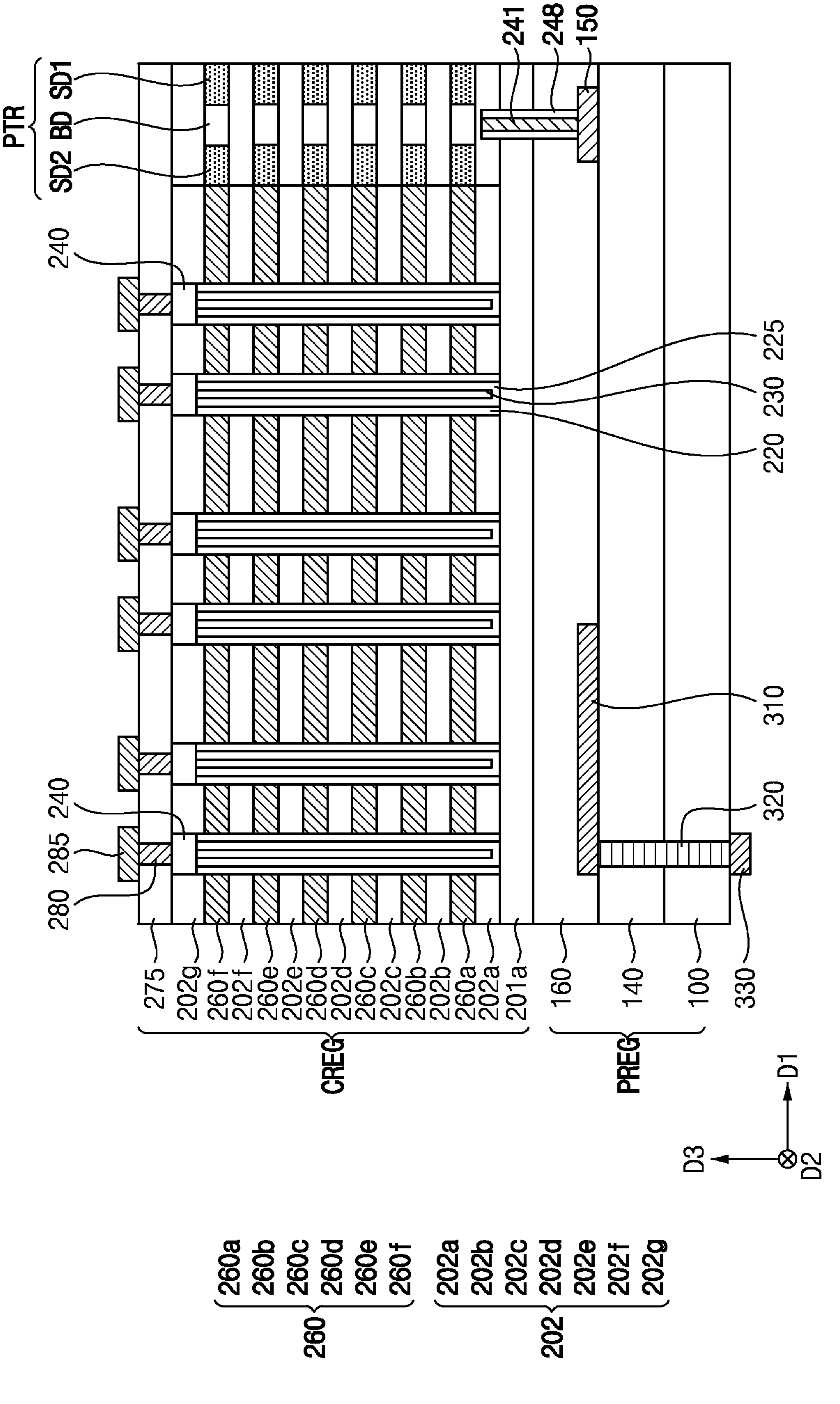
FIGS. 22 and 23 are cross-sectional views taken along lines I-I' and II-II' of FIG. 21, respectively.

FIG. 21 is a top view of a memory device according to example embodiments. FIG. 22 is a cross-sectional views taken along line I-I' of FIG. 21, and FIG. 23 is a cross-sectional view taken along line II-II' of FIG. 21.

In example embodiments, the memory device may be a non-volatile memory device. For example, the device may have a cell over periphery (COP) structure in which a memory cell structure is stacked on a peripheral circuit. The memory cell structure may have a vertical NAND flash memory device structure in which a plurality of NAND flash memory cells are formed vertically, for example in the vertical direction D3, with respect to a top surface of a substrate.

For clear and concise description, some elements of the memory device may be omitted from FIG. 21. For example, FIG. 21 illustrates base layer patterns 210*a*, 210*b* and 210*c*, separation layer patterns 206, a second impurity region 266, and pads 240, and other elements may be omitted.

Figure 23:
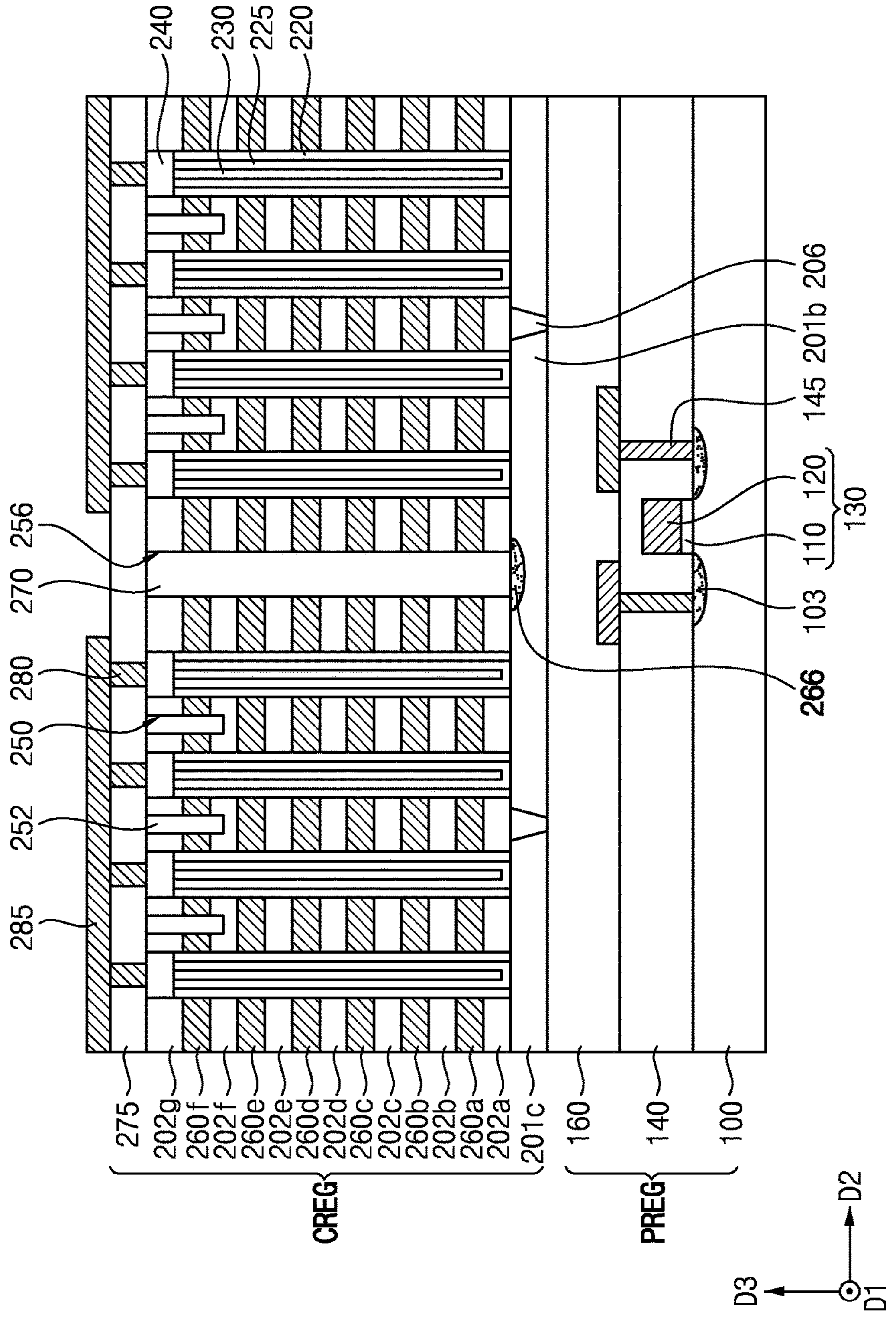

Referring to FIGS. 21, 22 and 23, the memory device may include a peripheral circuit region PREG including a peripheral circuit structure and a memory cell region CREG including a memory cell structure.

The peripheral circuit structure may include, e.g., a transistor including a gate structure 130 and a source/drain region 103 formed on a substrate 100, lower insulation layers 140 and 160, a lower contact 145, and lower wirings 150 and 310.

The substrate 100 may include a semiconductor material, e.g., single crystalline silicon or a single crystalline germanium. The gate structure 130 may include a gate insulation layer pattern 110 and a gate electrode 120, which may be stacked on the substrate 100. The transistor may be disposed and defined on the substrate 100.

The gate insulation layer pattern 110 may include, e.g., silicon oxide or a metal oxide. The gate electrode 120 may include, e.g., a metal, a metal nitride or doped polysilicon. The source/drain region 103 may include n-type or p-type impurities.

A first lower insulation layer 140 may be formed on the substrate 100 to cover the structure such as the transistor, and the lower contact 145 may extend through the first lower insulation layer 140 to be electrically connected to the source/drain region 103.

The lower wirings 150 and 310 may be disposed on the first lower insulation layer 140 and may be electrically connected to the lower contact 145 and the through-substrate via 320 respectively. A second lower insulation layer 160 may be formed on the first lower insulation layer 140 to cover the lower wirings 150 and 310. FIG. 22 illustrates a non-limiting example that the lower wirings 150 and 310 are formed in the same layer, but the lower wirings may be distributed in different wiring layers.

The first and second lower insulation layers 140 and 160 may include an insulating material, e.g., silicon oxide. The lower contact 145 and the lower wirings 150 and 310 may include, e.g., a metal, a metal nitride or doped polysilicon.

The memory cell structure may include first to third base layer patterns 201*a*, 201*b* and 201*c*, a channel 225, the gate line 260, a bitline 285 and a connecting wiring 296, etc.

The separation layer pattern 206 may be extended in the first horizontal direction D1, and a plurality of the separation layer patterns 206 may be arranged along the second horizontal direction D2. Thus, a base layer may be physically divided into the first to third base layer patterns 201*a*, 201*b* and 201*c*. Although FIGS. 21, 22 and 23 illustrate three base layer patterns 201*a*, 201*b* and 201*c*, embodiments are not limited thereto.

The base layer patterns 201*a*, 201*b* and 201*c* may include polysilicon or single crystalline silicon. In some embodiments, the base layer patterns 201*a*, 201*b* and 201*c* may further include p-type impurities such as boron (B). In this case, the base layer patterns 201*a*, 201*b* and 201*c* may serve as a p-type well.

The separation layer pattern 206 may be extended linearly in the first horizontal direction D1. The base layer patterns 201*a*, 201*b* and 201*c* may be physically separated by the separation layer pattern 206. The separation layer pattern 206 may include an insulation layer pattern, e.g., silicon oxide.

The channel 225 may be disposed on the base layer patterns 201*a*, 201*b* and 201*c*, and may extend in the vertical direction D3 from top surfaces of the base layer patterns 201*a*, 201*b* and 201*c*. The channel 225 may have a hollow cylindrical shape or a cup shape. The channel 225 may include polysilicon or single crystalline silicon, and may include an impurity region doped with, e.g. p-type impurities such as boron.

A plurality of the channels 225 may be arranged in the first horizontal direction D1 to form a channel row, and a plurality of the channel rows may be arranged in the second horizontal direction D2. In some example embodiments, the channels 225 included in the neighboring channel rows may be arranged in a zigzag arrangement to face each other. Thus, a density of the channels 225 in a unit area of the base layer pattern 201*a*, 201*b* and 201*c* may be increased.

A filling layer pattern 230 may be formed in an inner space of the channel 225. The filling layer pattern 230 may have a pillar shape or a solid cylindrical shape. The filling layer pattern 230 may include an insulation layer pattern, e.g., silicon oxide.

According to an embodiment, the channel 225 may have a pillar shape or a solid cylindrical shape. In an embodiment, the filling layer pattern 230 may be omitted.

A dielectric layer structure 220 may be formed on an outer sidewall of the channel 225. The dielectric layer structure 220 may have a cup shape of which a central bottom is opened, or a straw shape.

The dielectric layer structure 220 may include a tunnel insulation layer, a charge storage layer and a blocking layer which may be sequentially stacked from the outer sidewall of the channel 225. The blocking layer may include silicon oxide or a metal oxide such as hafnium oxide or aluminum oxide. The charge storage layer may include a nitride such as silicon nitride or a metal oxide, and the tunnel insulation layer may include an oxide such as silicon oxide. For example, the dielectric layer structure 220 may have an oxide-nitride-oxide (ONO) layers-stacked structure.

The pad 240 may be formed on the filling layer pattern 230, the channel 225 and the dielectric layer structure 220. For example, the filling layer pattern 230, the channel 225 and the dielectric layer structure 220 may be capped or closed by the pad 240. The pad 240 may include a polysilicon or single crystalline silicon. The pad 240 may further include n-type impurities, for example, phosphorus (P) or arsenic (As).

As illustrated in FIG. 22, a plurality of the pads 240 may be arranged in the first horizontal direction D1 to form a pad row substantially comparable to the channel row. A plurality of the pad rows may be arranged in the second horizontal direction D2.

The gate lines 260 (e.g., gate lines 260*a* through 260*f*) may be disposed on an outer sidewall of the dielectric layer structure 220 and may be spaced apart from each other in the vertical direction D3. In example embodiments, each gate line 260 may surround the channels 225 of at least one channel row and may be extended to the first horizontal direction D1.

For example, as illustrated in FIGS. 21, 22 and 23, each gate line 260 may surround six channel rows, however, the number of the channel rows surrounded by each gate line 260 is not specifically limited.

The gate line 260 may include a metal having a low electrical resistance and/or a nitride thereof. For example, the gate line 260 may include tungsten (W), tungsten nitride, titanium (Ti), titanium nitride, tantalum (Ta), tantalum nitride, platinum (Pt), or the like. In some embodiments, the gate line 260 may have a multi-layered structure including a barrier layer formed of a metal nitride and a metal layer.

For example, a lowermost gate line 260*a* may serve as a ground selection line (GSL). Four gate lines 260*b*, 260*c*, 260*d* and 260*e* on the GSL may serve as wordlines. An uppermost gate line 260*f* on the wordlines may serve as a string selection line (SSL).

In this case, the GSL, the wordlines, and the SSL may be formed at a single level, four levels and a single level, respectively. However, embodiments are not limited thereto, and in some embodiments there may be any number of levels of each of the GSL, the wordline and the SSL. According to some embodiments, the GSL and the SSL may be formed at two levels, respectively, and the wordline may be formed at 2^n levels such as 4, 8 or 16 levels. The stacked number of the gate lines 260 may be determined in consideration of a circuit design and a degree of integration of the semiconductor device.

Insulating interlayers 202 (e.g., insulating interlayers 202*a* to 202*g*) may be disposed between the gate lines 260 neighboring along the vertical direction D3. The insulating interlayers 202 may include a silicon oxide based material, e.g., silicon dioxide (SiO2), silicon oxycarbide (SiOC) or silicon oxyfluoride (SiOF). The gate lines 260 may be insulated from each other along the vertical direction D3 by the insulating interlayers 202.

The gate line cut region 256 may be formed through the gate lines 260 and the insulating interlayers 202 along the vertical direction D3. The gate line cut region 256 may have a trench shape or a ditch shape extending in the first horizontal direction D1.

A gate line cut pattern 270 extending in the first horizontal direction D1 may be disposed on the second impurity region 266. A plurality of the second impurity regions 266 and the gate line cut patterns 270 may be arranged along the second horizontal direction D2. In some embodiments, the second impurity region 266 may include n-type impurities, for example, phosphorus (P) or arsenic (As). The gate line cut pattern 270 may include an insulation layer pattern, e.g., silicon oxide. In some embodiments, a metal silicide pattern such as a cobalt silicide pattern and/or a nickel silicide pattern may be further formed on the second impurity region 266.

In some example embodiments, a cell block sharing the gate lines 260 may be defined by the gate line cut pattern 270. The cell block may be divided into sub-cell blocks by the separation layer pattern 206. Thus, a dimension or a size of an individual block may be reduced, so that a segmented operational control may be achieved, In some embodiments, one of the second impurity regions 266 and one of the gate line cut patterns 270 may be provided for each base layer pattern 201*a*, 201*b* and 201*c*. As illustrated in FIG. 23, for example, the second impurity region 266 may be formed at a central region of the second base layer pattern 201*b*, and the gate line cut pattern 270 may be disposed on the second impurity region 266.

A connecting contact and a connecting wiring may be provided per each base layer pattern 201*a*, 201*b* and 201*c* to transfer an electrical signal and/or a voltage from a peripheral circuit.

An upper gate line cut pattern 252 may be formed in the upper gate line cut region 250. The upper gate line cut pattern 252 may include an insulation material, e.g., silicon oxide.

In example embodiments, the upper gate line cut region 250 or the upper gate line cut pattern 252 may be provided for a separation of the SSL in each cell block. In this case, the upper gate line cut region 250 or the upper gate line cut pattern 252 may extend through an uppermost insulating interlayer 202*g* and the SSL (e.g, the uppermost gate line 260*f*), and may extend partially through an insulating interlayer 202*f* directly under the SSL (e.g, the uppermost gate line 260*f*).

An upper insulation layer 275 may be formed on the uppermost insulating interlayer 202*g*, the pad 240, the upper gate line cut pattern 252, the gate line cut pattern 270, the first connecting contact 244*a* and the second connecting contact 244*b*.

A bitline contact 280 may be formed through the upper insulation layer 275 to make contact with the pad 240. A plurality of the bitline contacts 280 may be formed to define an array comparable to an arrangement of the channels 225 or the pads 240.

The bitline 285 may be disposed on the upper insulation layer 275 to be electrically connected to the bitline contact 280. For example, the bitline 285 may extend in the second horizontal direction D2 to be electrically connected to a plurality of the bitline contacts 280. The bitline 285 and the separation layer pattern 205 may extend in substantially the same direction.

According to example embodiments described above, the base layer may be physically separated by the separation layer pattern 206. Thus, the first to third base layer patterns 201*a*, 201*b* and 201*c* capable of being operated independently or individually may be obtained.

The cell block may be further segmented or divided by the separation layer pattern 206, and thus signal interference or disturbance due to the large size of cell block may be reduced. Thus, reliability of the semiconductor device may be improved.

Input-output pads 330 may be arranged near one side of the bottom surface of the semiconductor substrate 100. A plurality of through-substrate vias 320 may be formed such that the through-substrate vias 320 may penetrate the semiconductor substrate 100 and a portion 140 of the lower insulation layer 140 and 160. The through-substrate vias 320 may connect the input-output pads 330 with a plurality of lower wiring patterns 310 in the lower insulation layer 140 and 160. The through-substrate vias may overlap with the portion of the memory cell array in the vertical direction D3. As such, the size of the memory device may be further reduced by forming the input-output pads 330 such that the input-output pads 330 may overlap with the memory cell region CREG in the vertical direction D3.

In some example embodiments, as shown in FIG. 21, a plurality of pass transistor blocks PTB1 and PTB2 may be disposed on the side of the plurality of memory blocks MB1 and MB2 in the first horizontal direction D1. As shown in FIG. 22, each of the plurality of pass transistor blocks PTB1 and PTB2 may include a plurality of pass transistors PTR stacked in the vertical direction D3. Each pass transistor PTR may include a first source-drain electrode SD1, a body region BD, a second source-drain electrode SD2 and a gate electrode as described above. Block selection signals may be applied to gate electrodes of the pass transistors PTR through the connection contact 248 and the lower wiring 150. An insulating layer pattern 241 may be formed on a sidewall of the connection contact 248.

Figure 24:
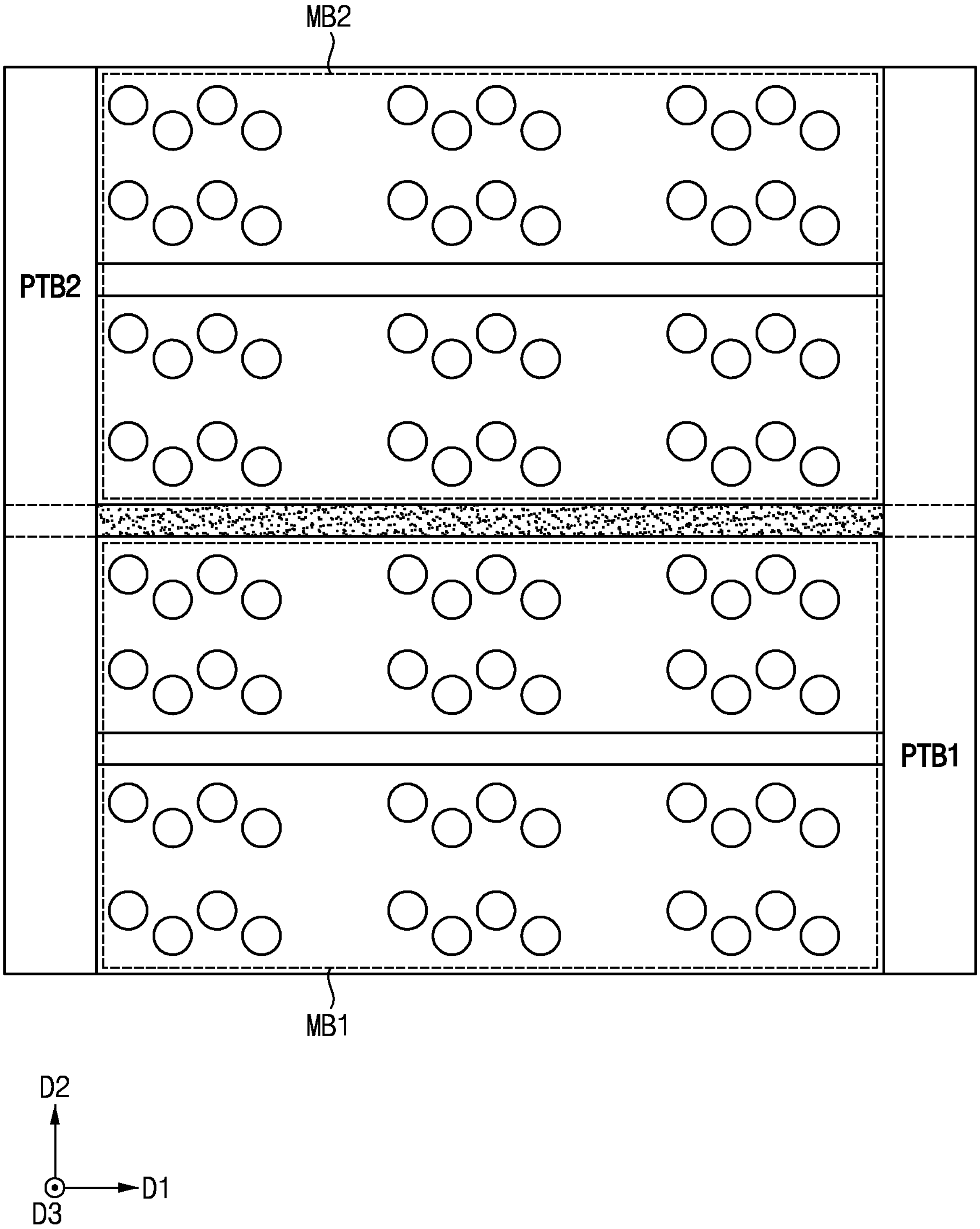
FIG. 24 is a top view of a memory device according to example embodiments.

FIG. 24 is a top view of a memory device according to example embodiments.

The memory device illustrated in FIG. 24 may be substantially the same as the memory device described with reference to FIGS. 21, 22 and 23 except for the arrangement of pass transistor blocks, and therefore redundant or duplicative descriptions thereof may be omitted.

In the memory device of FIG. 21, the plurality of memory blocks MB1 and MB2 are arranged in the second horizontal direction D2, and the plurality of pass transistor blocks PTB1 and PTB2 corresponding to the plurality of memory blocks MB1 and MB2 are disposed on one side of the first horizontal direction D1. In the memory device of FIG. 24, the plurality of pass transistor blocks PTB1 and PTB2 are distributed and disposed on both sides in the first horizontal direction D1 of the plurality of memory blocks MB1 and MB2.

Figure 25:
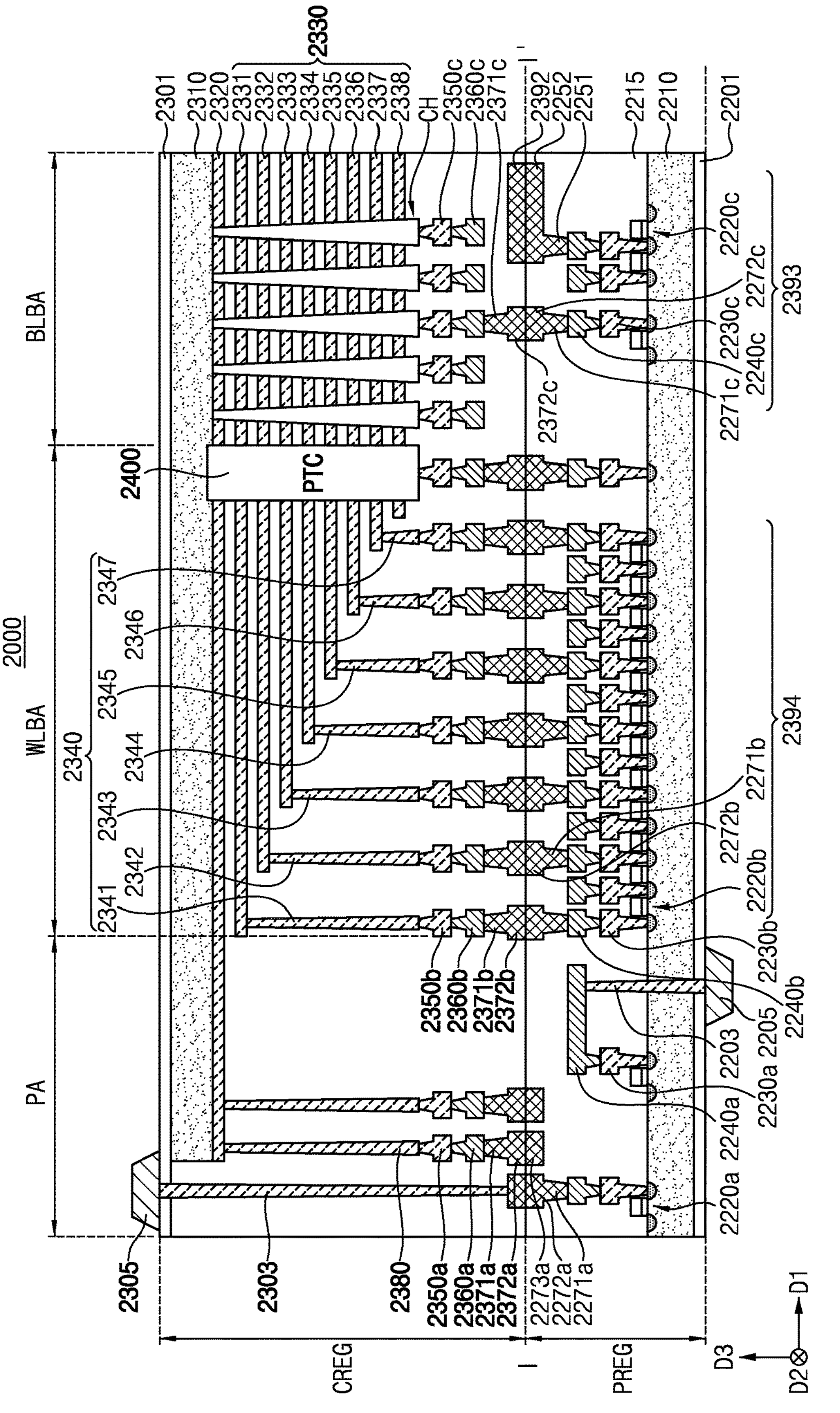
FIG. 25 is a cross-sectional view of a nonvolatile memory device according to example embodiments.

FIG. 25 is a cross-sectional view of a nonvolatile memory device according to example embodiments.

Referring to FIG. 25, a nonvolatile memory device or a memory device 2000 may have a chip-to-chip (C2C) structure. The C2C structure may refer to a structure formed by manufacturing an upper chip including a memory cell region or a cell region CREG on a first wafer, manufacturing a lower chip including a peripheral region PREG on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, the bonding metals may include copper (Cu) using a Cu-to-Cu bonding. Example embodiments, however, are not limited thereto. For example, the bonding metals may also be formed of aluminum (Al) or tungsten (W).

Each of the peripheral region PREG and the cell region CREG of the memory device 2000 may include an external pad bonding area PA, a wordline bonding area WLBA, and a bitline bonding area BLBA.

The peripheral region PREG may include a first substrate 2210, an interlayer insulating layer 2215, a plurality of circuit elements 2220*a*, 2220*b*, and 2220*c* formed on the first substrate 2210, first metal layers 2230*a*, 2230*b*, and 2230*c* respectively connected to the plurality of circuit elements 2220*a*, 2220*b*, and 2220*c*, and second metal layers 2240*a*, 2240*b*, and 2240*c* formed on the first metal layers 2230*a*, 2230*b*, and 2230*c*. In an example embodiment, the first metal layers 2230*a*, 2230*b*, and 2230*c* may be formed of a metal having a relatively high electrical resistivity, such as tungsten, and the second metal layers 2240*a*, 2240*b*, and 2240*c* may be formed of a metal having a relatively low electrical resistivity, such as copper.

Although only the first metal layers 2230*a*, 2230*b*, and 2230*c* and the second metal layers 2240*a*, 2240*b*, and 2240*c* are shown in FIG. 25, example embodiments are not limited thereto, and one or more additional metal layers may be further formed on the second metal layers 2240*a*, 2240*b*, and 2240*c*. At least a portion of the one or more additional metal layers formed on the second metal layers 2240*a*, 2240*b*, and 2240*c* may be formed of a metal, such as aluminum, having a lower electrical resistivity than the metal (e.g., copper) forming the second metal layers 2240*a*, 2240*b*, and 2240*c*.

The interlayer insulating layer 2215 may be disposed on the first substrate 2210 and cover the plurality of circuit elements 2220*a*, 2220*b*, and 2220*c*, the first metal layers 2230*a*, 2230*b*, and 2230*c*, and the second metal layers 2240*a*, 2240*b*, and 2240*c*. The interlayer insulating layer 2215 may include an insulating material such as silicon oxide, silicon nitride, or the like.

Lower bonding metals 2271*b* and 2272*b* may be formed on the second metal layer 2240*b* in the wordline bonding area WLBA. In the wordline bonding area WLBA, the lower bonding metals 2271*b* and 2272*b* in the peripheral region PREG may be electrically bonded to upper bonding metals 2371*b* and 2372*b* of the cell region CREG. The lower bonding metals 2271*b* and 2272*b* and the upper bonding metals 2371*b* and 2372*b* may be formed of aluminum, copper, tungsten, or the like. Further, the upper bonding metals 2371*b* and 2372*b* in the cell region CREG may be referred as first metal pads and the lower bonding metals 2271*b* and 2272*b* in the peripheral region PREG may be referred as second metal pads.

The cell region CREG may include at least one memory block. The cell region CREG may include a second substrate 2310 and a common source line 2320. On the second substrate 2310, a plurality of wordlines 2330 (e.g. wordlines 2331, 2332, 2333, 2334, 2335, 2336, 2337, and 2338) may be stacked in a vertical direction D3 (e.g., a Z-axis direction), which may be perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the vertical direction D3 (e.g., the Z-axis direction), perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350*c* and a second metal layer 2360*c*. For example, the first metal layer 2350*c* may be a bitline contact, and the second metal layer 2360*c* may be a bitline. In an example embodiment, the bitline (e.g., the second metal layer 2360*c*) may extend in a second horizontal direction D2 (e.g., a Y-axis direction), parallel to the upper surface of the second substrate 2310.

In an example embodiment illustrated in FIG. 25, an area in which the channel structure CH, the bitline (e.g., the second metal layer 2360*c*), and the like are disposed may be referred to as the bitline bonding area BLBA. In the bitline bonding area BLBA, the bitline (e.g., the second metal layer 2360*c*) may be electrically connected to the circuit elements 2220*c* providing a page buffer 2393 in the peripheral region PREG. The bitline (e.g., the second metal layer 2360*c*) may be connected to upper bonding metals 2371*c* and 2372*c* in the cell region CREG, and the upper bonding metals 2371*c* and 2372*c* may be connected to lower bonding metals 2271*c* and 2272*c* connected to the circuit elements 2220*c* of the page buffer 2393.

In the wordline bonding area WLBA, driving signal lines may be formed at heights corresponding to the wordlines 2330. The driving signal lines may extend along the first direction D1 parallel to the upper surface of the second substrate 2310, and may be connected to the plurality of cell contact plugs 2340 (e.g., cell contact plugs 2341, 2342, 2343, 2344, 2345, 2346, 3347 and 3340). The driving signal lines and the cell contact plugs 2340 may be connected to each other through pads provided by extending at least some of the driving signal lines with different lengths along the first direction D1. A first metal layer 2350*b* and a second metal layer 2360*b* may be sequentially connected to upper portions of the cell contact plugs 2340 connected to the driving signal lines. The cell contact plugs 2340 may be connected to peripheral circuits in the wordline bonding area WLBA through the upper bonding metals 2371*b* and 2372*b* of the cell area CREG and the lower bonding metals 2271*b* and 2272*b* of the peripheral circuit area PREG.

A pass transistor circuit (PTC) 2400 may be formed in the wordline bonding area WLBA. The pass transistor circuit 2400 may correspond to any of the pass transistor circuits described above. The pass transistor circuit 2400 may include a plurality of pass transistor blocks respectively corresponding to a plurality of memory blocks. Each pass transistor block may include stacked pass transistors as described above. Each pass transistor may apply a driving signal applied to a corresponding driving signal line to a corresponding wordline in response to a block selection signal.

The plurality of cell contact plugs 2340 may be electrically connected to the circuit elements 2220*b* forming a row decoder 2394 in the peripheral region PREG. In an example embodiment, operating voltages of the circuit elements 2220*b* forming the row decoder 2394 may be different than operating voltages of the circuit elements 2220*c* forming the page buffer 2393. For example, operating voltages of the circuit elements 2220*c* forming the page buffer 2393 may be greater than operating voltages of the circuit elements 2220*b* forming the row decoder 2394.

A common source line contact plug 2380 may be disposed in the external pad bonding area PA. The common source line contact plug 2380 may be formed of a conductive material, such as a metal, a metal compound, polysilicon, or the like, and may be electrically connected to the common source line 2320. A first metal layer 2350*a* and a second metal layer 2360*a* may be stacked on an upper portion of the common source line contact plug 2380, sequentially. For example, an area in which the common source line contact plug 2380, the first metal layer 2350*a*, and the second metal layer 2360*a* are disposed may be referred to as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220*a*, 2220*b*, and 2220*c* disposed in the peripheral region PREG through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220*a*, 2220*b*, and 2220*c* disposed in the peripheral region PREG through a second input/output contact plug 2303. In an example embodiment, the second input/output pad 2305 is electrically connected to a circuit element 2220*a*.

According to embodiments, the second substrate 2310 and the common source line 2320 may not be disposed in an area in which the second input/output contact plug 2303 is disposed. Also, the second input/output pad 2305 may not overlap the wordlines 2330 in the vertical direction D3 (e.g., the Z-axis direction). The second input/output contact plug 2303 may be separated from the second substrate 2310 in the direction, parallel to the upper surface of the second substrate 310, and may pass through the interlayer insulating layer 2315 of the cell region CREG to be connected to the second input/output pad 2305.

According to example embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. In some embodiments, the memory device 200 may include both the first input/output pad 2205 and the second input/output pad 2305.

In some embodiments, a metal pattern provided on an uppermost metal layer may be provided as a dummy pattern or the uppermost metal layer may be absent, in each of the external pad bonding area PA and the bitline bonding area BLBA, respectively included in the cell region CREG and the peripheral region PREG.

In the external pad bonding area PA, the memory device 2000 may include a lower metal pattern 2273*a*, corresponding to an upper metal pattern 2372*a* formed in an uppermost metal layer of the cell region CREG, and having the same cross-sectional shape as the upper metal pattern 2372*a* of the cell region CREG so as to be connected to each other, in an uppermost metal layer of the peripheral region PREG. In the peripheral region PREG, the lower metal pattern 2273*a* formed in the uppermost metal layer of the peripheral region PREG may not be connected to a contact. Similarly, in the external pad bonding area PA, an upper metal pattern 2372*a*, corresponding to the lower metal pattern 2273*a* formed in an uppermost metal layer of the peripheral region PREG, and having the same shape as a lower metal pattern 2273*a* of the peripheral region PREG, may be formed in an uppermost metal layer of the cell region CREG.

The lower bonding metals 2271*b* and 2272*b* may be formed on the second metal layer 2240*b* in the wordline bonding area WLBA. In the wordline bonding area WLBA, the lower bonding metals 2271*b* and 2272*b* of the peripheral region PREG may be electrically connected to the upper bonding metals 2371*b* and 2372*b* of the cell region CREG by a Cu-to-Cu bonding.

Further, in the bitline bonding area BLBA, an upper metal pattern 2392, corresponding to a lower metal pattern 2252 formed in the uppermost metal layer of the peripheral region PREG, and having the same cross-sectional shape as the lower metal pattern 2252 of the peripheral region PREG, may be formed in an uppermost metal layer of the cell region CREG. A contact may not be formed on the upper metal pattern 2392 formed in the uppermost metal layer of the cell region CREG.

Figure 26:
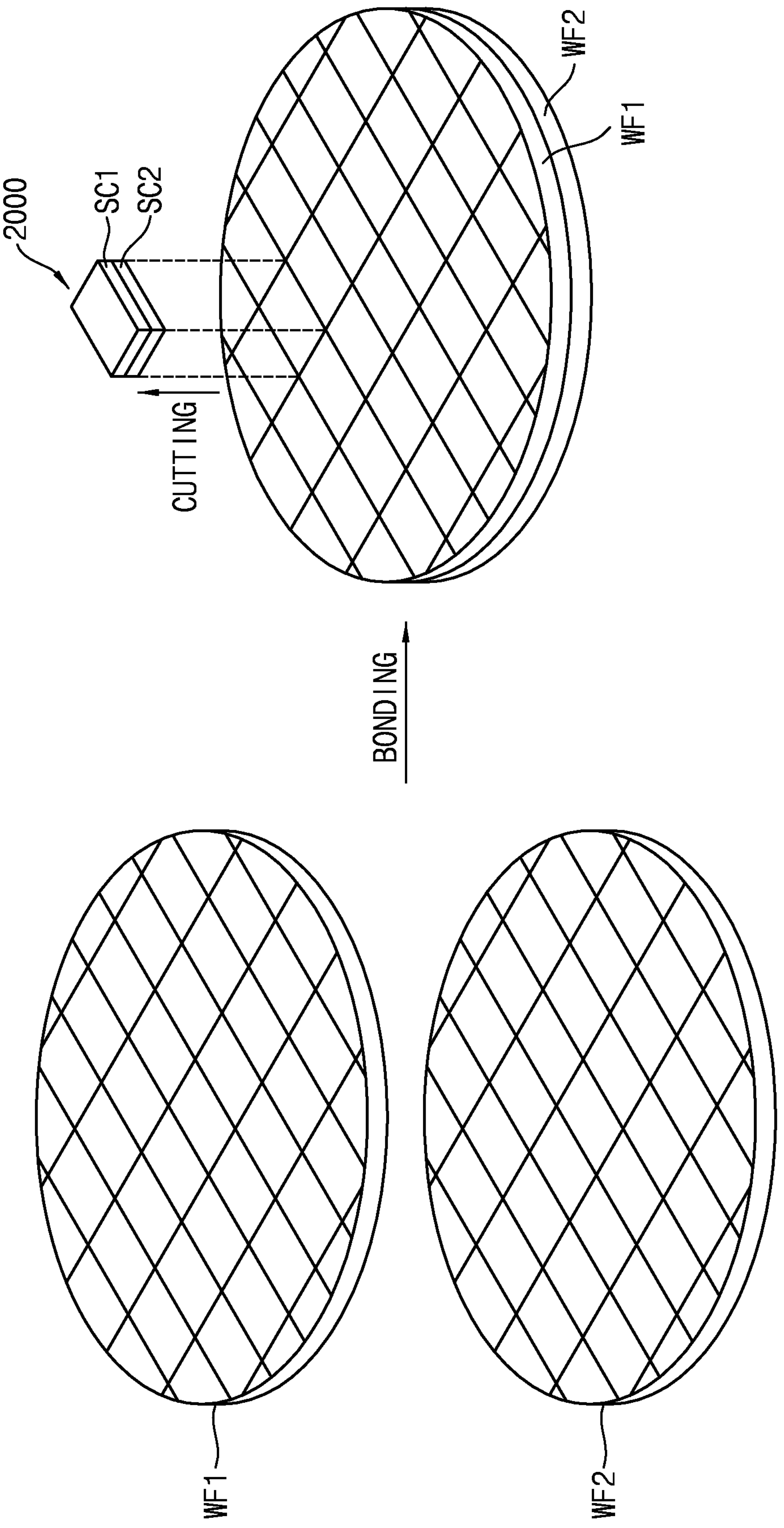
FIG. 26 is a conceptual diagram illustrating manufacturing processes of a stacked semiconductor device according to example embodiments.

FIG. 26 is a conceptual diagram illustrating manufacturing processes of a stacked semiconductor device according to example embodiments.

Referring to FIG. 26, respective integrated circuits may be formed on a first wafer WF1 and a second wafer WF2. For example, the memory cell array may be formed in the first wafer WF1 and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into separate chips, in which each chip corresponds to a semiconductor device such as, for example, the nonvolatile memory device 2000, including a first semiconductor die SC1 and a second semiconductor die SC2 that are stacked vertically (e.g., the first semiconductor die SC1 is stacked on the second semiconductor die SC2, etc.). Each cut portion of the first wafer WF1 corresponds to the first semiconductor die SC1 and each cut portion of the second wafer WF2 corresponds to the second semiconductor die SC2.

Figure 27:
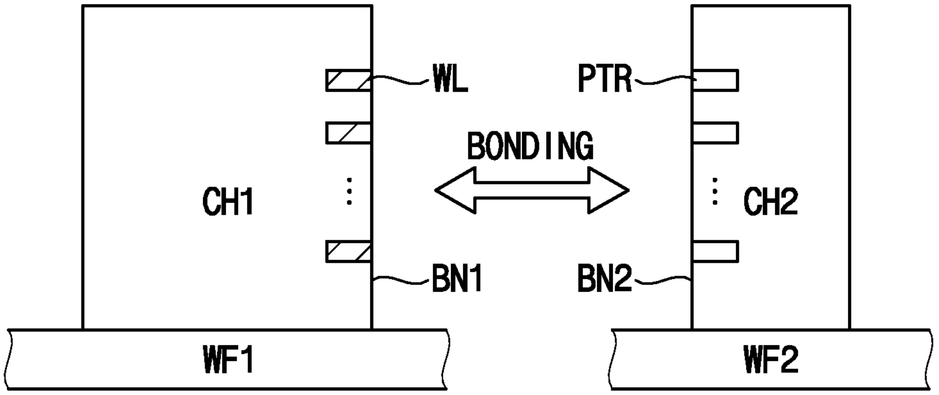
FIGS. 27 and 28 are diagrams illustrating manufacturing processes of a nonvolatile memory device according to example embodiments.
Figure 28:
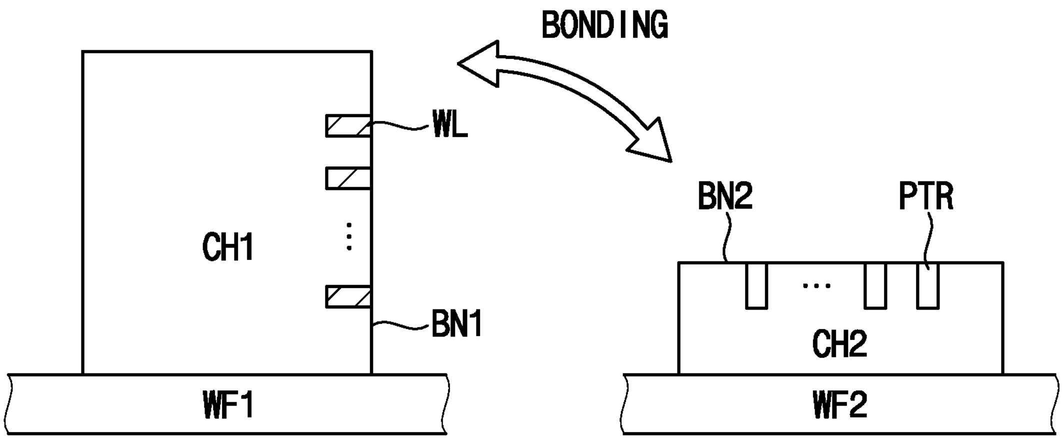

FIGS. 27 and 28 are diagrams illustrating manufacturing processes of a nonvolatile memory device according to example embodiments.

Referring to FIGS. 27 and 28, a first chip CH1 including a memory block and a second chip CH2 including a pass transistor block may be formed through independent manufacturing processes and then bonded to each other using a bonding method.

For example, the first chip CH1 may be formed on a first wafer WF1 and the second chip CH2 may be formed on a second wafer WF2. In some example embodiments, as shown in FIG. 27, a plurality of pass transistors PTR may be sequentially formed in a direction perpendicular to the upper surface of the second wafer WF2. In other example embodiments, as shown in FIG. 28, a plurality of pass transistors PTR may be simultaneously formed in a direction parallel to the upper surface of the second wafer WF2.

The wafers WF1 and WF2 may be cut into a plurality of chips, and the bonding surface BN1 of each of the cut first chips CH1 and the bonding surface BN2 of each of the cut second chips CH2 may be bonded. In this way, each wordline WL included in the first chip CH1 may be coupled to a corresponding pass transistor PTR included in the second chip CH2.

Figure 29:
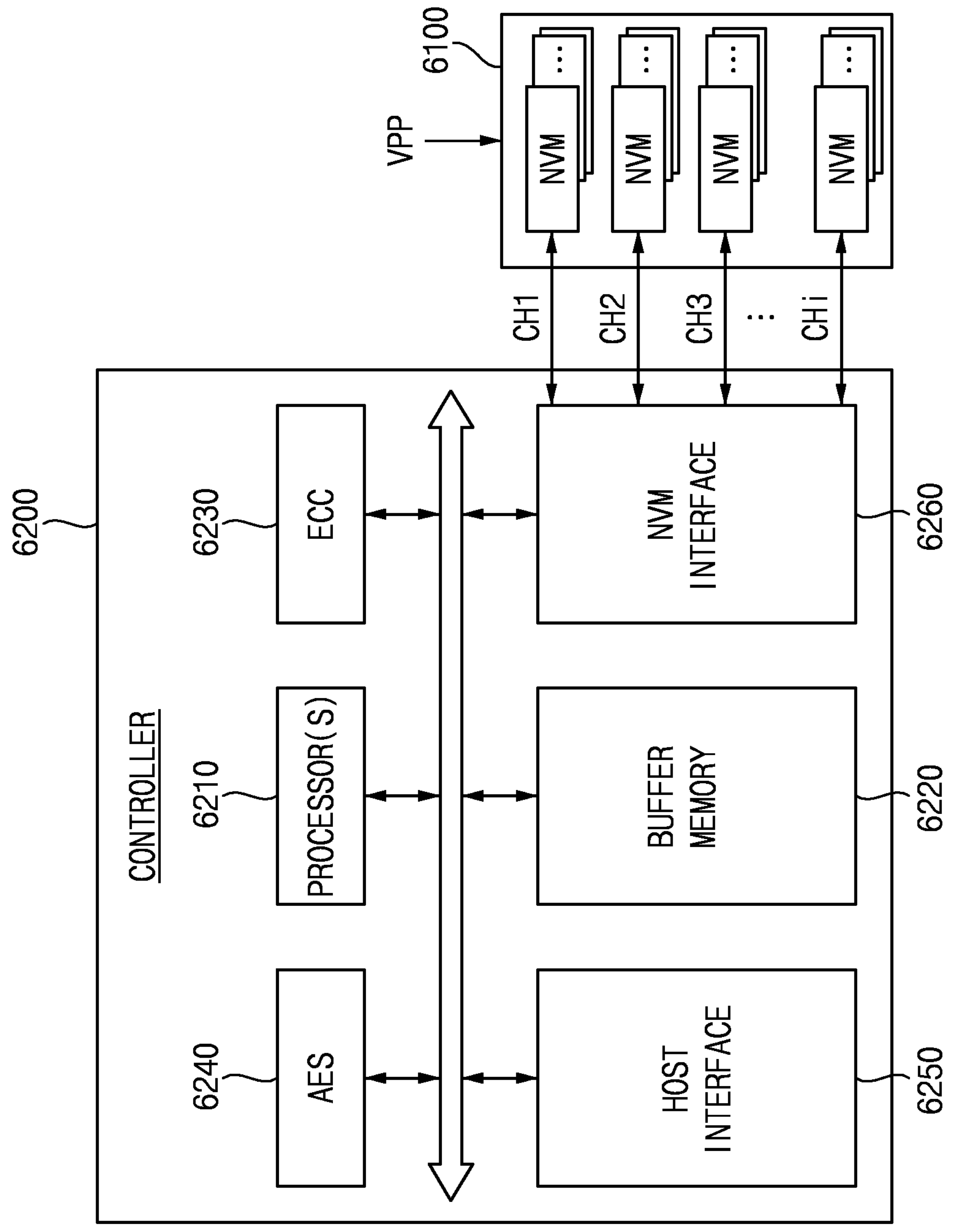
FIG. 29 is a block diagram illustrating a storage device according to example embodiments.

FIG. 29 is a block diagram illustrating a storage device according to example embodiments. In some example embodiments, a storage device of FIG. 18 may be a solid state drive (SSD).

Referring to FIG. 29, an SSD 6000 may generally include nonvolatile memory devices 6100 and an SSD controller 5200.

The nonvolatile memory devices 6100 may be configured to receive a high voltage VPP. One or more of the nonvolatile memory devices 6100 may be provided as memory devices, according to the present disclosure as described above. Accordingly, the nonvolatile memory devices 6100 may include the stacked pass transistors as described above.

The SSD controller 6200 may be connected to the nonvolatile memory devices 6100 via multiple channels CH1, CH2, CHI3, . . . , CH1, where i is an integer greater than 0. The SSD controller 6200 may include one or more processors 6210, a buffer memory 6220, an error correction code (ECC) circuit 6230, an advanced encryption standard (AES) engine 6240, a host interface 6250, and a nonvolatile memory interface 6260. The buffer memory 6220 may store data used to drive the SSD controller 6200. The buffer memory 6220 may include multiple memory lines. Each memory line may store data and/or commands. The ECC circuit 6230 may calculate error correction code values of data to be programmed at a writing operation, and may correct an error of read data using an error correction code value at a read operation. In a data recovery operation, the ECC circuit 6230 may correct an error of data recovered from the nonvolatile memory devices 6100.

The AES engine 6240 may perform at least one of encryption and decryption of data input to and/or output from the SSD controller 6200 using a symmetric key algorithm. As described above, the memory device according to example embodiments may have a reduced size by driving the wordlines using the pass transistors that are stacked in the vertical direction. In addition, the memory device according to example embodiments may enhance the design margin and reduce the power consumption by simplifying wiring routing of the block selection signals and the driving signals that are applied to the stacked transistors.

Embodiments of the present disclosure may be applied to electronic devices and/or systems including a nonvolatile memory device. For example, embodiments of the present disclosure may be applied to systems such as, but not limited to, a memory card, a solid state drive (SSD), an embedded multimedia card (eMMC), a universal flash storage (UFS), a mobile phone, a smartphone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an Internet of Things (IoT) device, an Internet of Everything (IoE) device, an e-book, a virtual reality (VR) device, an augmented reality (AR) device, a server system, an automotive driving system, and the like.

The foregoing is illustrative of example embodiments and is not to be construed as limiting thereof. Although a few example embodiments have been described, those skilled in the art will readily appreciate that many modifications are possible i without materially departing from the scope of the present disclosure.

What is claimed is:

1. A memory device comprising:

a memory block comprising a plurality of wordlines stacked in a vertical direction and extending in a first horizontal direction; and a pass transistor block comprising a plurality of pass transistors stacked in the vertical direction, wherein the plurality of pass transistors are configured to transmit a plurality of driving signals respectively to the plurality of wordlines, wherein each pass transistor of the plurality of pass transistors comprises:

a body region having an upper surface and a lower surface which face in the vertical direction, a first side surface and a second side surface which face in the first horizontal direction, and a front surface and a rear surface which face in a second horizontal direction;

a first source-drain electrode on the first side surface, and configured to receive a corresponding driving signal of the plurality of driving signals;

a second source-drain electrode on the second side surface, wherein the second source-drain electrode is electrically connected to a side surface of a corresponding wordline of the plurality of wordlines; and a first vertical gate electrode on a first surface from among the front surface and the rear surface, wherein the plurality of pass transistors comprise a group of pass transistors which are disposed at a same height in the vertical direction, wherein the plurality of wordlines comprise a group of wordlines which are vertically adjacent to each other, and wherein the group of pass transistors are connected to the group of wordlines.

2. The memory device of claim 1, wherein the first vertical gate electrode is included in a first gate line extending in the vertical direction.

3. The memory device of claim 2, wherein the plurality of pass transistors are simultaneously switched based on a block selection signal applied to the first gate line.

4. The memory device of claim 1, wherein the each pass transistor further comprises:

an upper horizontal gate electrode disposed on the upper surface of the body region; and a lower horizontal gate electrode disposed on the lower surface of the body region.

5. The memory device of claim 4, wherein the first vertical gate electrode is included in a first gate line extending in the vertical direction, and wherein the upper horizontal gate electrode and the lower horizontal gate electrode are connected to the first gate line.

6. The memory device of claim 4, wherein the plurality of pass transistors comprise a first pass transistor which is vertically adjacent to a second pass transistor, wherein the first pass transistor comprises a first upper horizontal gate electrode and a first lower horizontal gate electrode, and the second pass transistor comprises a second upper horizontal gate electrode and a second lower horizontal gate electrode, and wherein the first upper horizontal gate electrode and the second lower horizontal gate electrode are integrally formed as one conductor.

7. The memory device of claim 4, wherein a channel of the each pass transistor is formed in the body region under the first surface, the upper surface and the lower surface.

8. The memory device of claim 1, wherein the each pass transistor further comprises:

a second vertical gate electrode disposed on a second surface from among the front surface and the rear surface.

9. The memory device of claim 8, wherein the first vertical gate electrode is included in a first gate line extending in the vertical direction, wherein the second vertical gate electrode is included in a second gate line extending in the vertical direction, and wherein an end portion in the vertical direction of the first gate line is electrically connected to an end portion in the vertical direction of the second gate line.

10. The memory device of claim 1, wherein the each pass transistor further comprises:

a second vertical gate electrode disposed on a second surface from among the front surface and the rear surface;

an upper horizontal gate electrode disposed on the upper surface; and a lower horizontal gate electrode disposed on the lower surface.

11. The memory device of claim 10, wherein the first vertical gate electrode is included in a first gate line extending in the vertical direction, wherein the second vertical gate electrode is included in a second gate line extending in the vertical direction, and wherein the upper horizontal gate electrode and the lower horizontal gate electrode are connected to the first gate line and the second gate line.

12. The memory device of claim 10, wherein a channel of the each pass transistor is formed in the body region under the front surface, the rear surface, the upper surface and the lower surface.

13. The memory device of claim 1, wherein the each pass transistor and the corresponding wordline are disposed at a same height in the vertical direction.

14. The memory device of claim 1, wherein pass transistors of the group of pass transistors are arranged adjacent to each other in the second horizontal direction and extend in the first horizontal direction, and wherein a number of the pass transistors of the group of pass transistors is same as a number of wordlines of the group of wordlines.

15. The memory device of claim 14, further comprising:

a group of vertical connection conductors connected to second source-drain electrodes of the group of pass transistors; and a group of horizontal connection conductors connecting the group of vertical connection conductors with the group of wordlines, wherein a number of the group of vertical connection conductors and a number of the group of horizontal connection conductors are same as the number of the group of pass transistors and the number of the group of wordlines, respectively.

16. The memory device of claim 15, wherein the group of vertical connection conductors are spaced apart from each other in the second horizontal direction, and wherein each vertical connection conductor of the group of vertical connection conductors has a same horizontal length in the second horizontal direction and a same vertical length in the vertical direction.

17. A memory device comprising:

a plurality of memory blocks, wherein each memory block of the plurality of memory blocks comprises a plurality of wordlines stacked in a vertical direction and extending in a first horizontal direction; and a plurality of pass transistor blocks, wherein each pass transistor block from among the plurality of pass transistor blocks comprises a plurality of pass transistors stacked in the vertical direction, and is configured to transmit a plurality of driving signals to a plurality of wordlines included in a corresponding memory block, wherein each pass transistor of the plurality of pass transistors comprises:

a body region having an upper surface and a lower surface which face in the vertical direction, a first side surface and second side surface which face in the first horizontal direction, and a front surface and a rear surface which face in a second horizontal direction;

a first source-drain electrode on the first side surface, and configured to receive a corresponding driving signal of the plurality of driving signals;

a second source-drain electrode on the second side surface, wherein the second source-drain electrode is electrically connected to a side surface of a corresponding wordline of the plurality of wordlines; and a first vertical gate electrode on a first surface from among the front surface and the rear surface, wherein the plurality of pass transistors comprise a group of pass transistors which are disposed at a same height in the vertical direction, wherein the plurality of wordlines comprise a group of wordlines which are vertically adjacent to each other, and wherein the group of pass transistors are connected to the group of wordlines.

18. The memory device of claim 17, wherein the plurality of memory blocks are arranged in the second horizontal direction, and wherein the plurality of pass transistor blocks are distributed on the first side surface and the second side surface in the first horizontal direction.

19. The memory device of claim 17, wherein the plurality of memory blocks are formed on a first wafer and the plurality of pass transistor blocks are formed on a second wafer, and wherein the plurality of memory blocks are coupled to the plurality of pass transistor blocks using a bonding process.

20. A memory device comprising:

a plurality of first bonding metal patterns in a cell region;

a plurality of second bonding metal patterns in a peripheral region under the cell region, wherein the peripheral region is vertically coupled to the cell region by the plurality of first bonding metal patterns and the plurality of second bonding metal patterns;

a plurality of memory blocks in the cell region, wherein each memory block comprises a plurality of wordlines stacked in a vertical direction and extending in a first horizontal direction; and a plurality of pass transistor blocks in the cell region, wherein each pass transistor block from among the plurality of pass transistor blocks comprises a plurality of pass transistors stacked in the vertical direction, and configured to transmit a plurality of driving signals to a plurality of wordlines included in a corresponding memory block, wherein each pass transistor of the plurality of pass transistors comprises:

a body region having an upper surface and a lower surface which face in the vertical direction, a first side surface and second side surface which face in the first horizontal direction, and a front surface and a rear surface which face in a second horizontal direction;

a first source-drain electrode, on the first side surface, configured to receive a corresponding driving signal of the plurality of driving signals;

a second source-drain electrode on the second side surface, wherein the second source-drain electrode is electrically connected to a side surface of a corresponding wordline of the plurality of wordlines; and a first vertical gate electrode on a first surface from among the front surface and the rear surface, wherein the plurality of pass transistors comprise a group of pass transistors which are disposed at a same height in the vertical direction, wherein the plurality of wordlines comprise a group of wordlines which are vertically adjacent to each other, and wherein the group of pass transistors are connected to the group of wordlines.

* * * * *